(12) United States Patent
Yamaguchi et al.

(10) Patent No.: US 7,928,932 B2
(45) Date of Patent: Apr. 19, 2011

(54) DISPLAY ELEMENT DRIVE CIRCUIT AND DISPLAY APPARATUS

(75) Inventors: Ikuhiro Yamaguchi, Tokyo (JP); Manabu Takei, Sagamihara (JP)

(73) Assignee: Casio Computer Co., Ltd., Tokyo (JP)

( * ) Notice: Subject to any disclaimer, the term of this patent is extended or adjusted under 35 U.S.C. 154(b) by 993 days.

(21) Appl. No.: 11/235,601

(22) Filed: Sep. 26, 2005

(65) Prior Publication Data

US 2006/0066644 A1    Mar. 30, 2006

(30) Foreign Application Priority Data

Sep. 27, 2004 (JP) ................................. 2004-279268

(51) Int. Cl.
*G09G 3/30* (2006.01)
(52) U.S. Cl. .......................................... 345/76; 345/690
(58) Field of Classification Search .................. 345/204, 345/690, 76–83, 92; 438/26–32
See application file for complete search history.

(56) References Cited

U.S. PATENT DOCUMENTS

| | | | |
|---|---|---|---|
| 5,166,085 A * | 11/1992 | Wakai et al. ................... | 438/158 |
| 7,091,940 B2 | 8/2006 | Tsujimura et al. | |
| 7,355,571 B2 | 4/2008 | Yamada et al. | |
| 2002/0187573 A1* | 12/2002 | Kido ............................... | 438/158 |
| 2003/0089910 A1* | 5/2003 | Inukai .............................. | 257/66 |
| 2003/0201955 A1* | 10/2003 | Song et al. ........................ | 345/76 |
| 2003/0214522 A1* | 11/2003 | Kageyama et al. ............ | 345/690 |
| 2004/0007989 A1* | 1/2004 | Li .............................. | 315/169.3 |
| 2004/0142502 A1* | 7/2004 | Yoo et al. ......................... | 438/24 |
| 2004/0246210 A1* | 12/2004 | Azami ............................. | 345/76 |
| 2005/0056837 A1* | 3/2005 | Ohtani et al. .................... | 257/57 |
| 2005/0139824 A1* | 6/2005 | Park ................................ | 257/40 |

FOREIGN PATENT DOCUMENTS

| | | |
|---|---|---|
| JP | 61-131481 A | 6/1986 |
| JP | 2003-84686 A | 3/2003 |
| JP | 2003-158133 A | 5/2003 |
| JP | 2003-302936 A | 10/2003 |
| JP | 2004-12897 A | 1/2004 |
| JP | 2004-93774 A | 3/2004 |
| JP | 2004-96100 A | 3/2004 |

OTHER PUBLICATIONS

Japanese Office Action dated Mar. 16, 2010 and English translation therof issued in counterpart Japanese Application NO. 2004-279268.

* cited by examiner

*Primary Examiner* — Amare Mengistu
*Assistant Examiner* — Aaron Midkiff
(74) *Attorney, Agent, or Firm* — Holtz, Holtz, Goodman & Chick, PC

(57) ABSTRACT

A display element drive circuit includes a first circuit which holds as a voltage component electric charges based on a gradation signal corresponding to display data, a second circuit which supplies the gradation signal to the electric charge holding circuit at a timing of application of a selection signal, current control type display elements, and a third circuit which generates a driving current based on the voltage component held in the first circuit and supplies the generated driving current to the display element. One of the second and third circuits includes at least one field effect transistor. The field effect transistor includes gate, source and drain electrodes, and a source-side parasitic capacitance formed between the gate and source electrodes and a drain-side parasitic capacitance formed between the gate and drain electrodes of the field effect transistor have different capacitance values.

27 Claims, 20 Drawing Sheets

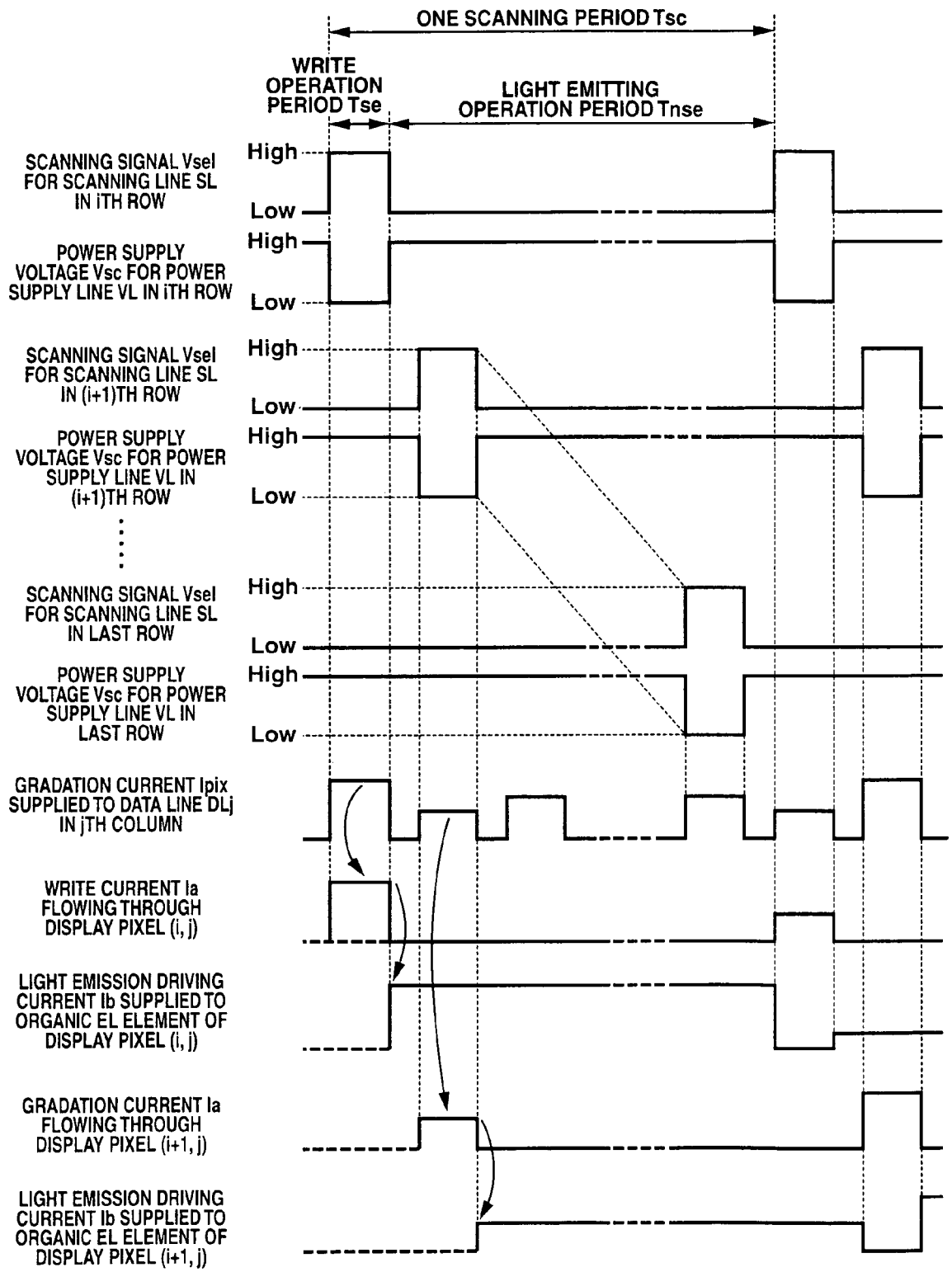

A-A CROSS SECTION

GATE WIDTH/GATE LENGTH (Ws/L)

| Ws/L | Cgp RATIO |
|---:|---:|
| 1 | 0.316013 |
| 3 | 0.539341 |
| 10 | 0.775957 |
| 30 | 0.907933 |
| 100 | 0.969841 |

DISPLAY ELEMENT DRIVE CIRCUIT AND DISPLAY APPARATUS

CROSS-REFERENCE TO RELATED APPLICATIONS

This application is based upon and claims the benefit of priority from prior Japanese Patent Application No. 2004-279268, filed Sep. 27, 2004, the entire contents of which are incorporated herein by reference.

BACKGROUND OF THE INVENTION

1. Field of the Invention

The present invention relates to a display element drive circuit and a display apparatus comprising the display element drive circuit, and more particularly to a display element drive circuit which is provided in each display pixel in a display panel and drives a display element based on a driving current corresponding to a gradation signal and to a display apparatus comprising a display panel in which display pixels each having the display element drive circuit are two-dimensionally arranged.

2. Description of the Related Art

There has been conventionally known a self-luminous type display (a display apparatus) including a display panel in which display pixels are two-dimensionally arranged, the display pixel provided with a light emitting element composed of a current control type display element which operates to emit light with a predetermined luminance gradation in accordance with a current value of a driving current supplied thereto like an organic electroluminescent element (which will be referred to as an "organic EL element" hereinafter), an inorganic electroluminescent element, a light emitting diode (an LED) or the like.

In particular, a self-luminous type display to which an active matrix drive mode is applied has a higher display response speed than that of a liquid crystal display apparatus (an LCD) recently widely utilized in various electronic devices, e.g., a portable information device, a personal computer, a television receiver or the like. Further, the self-luminous type display does not have view field angle dependency, and can achieve an increase in luminance/contrast and in fineness of a display image quality. Furthermore, the self-luminous type display does not require a backlight as different from the liquid crystal display apparatus, and hence the self-luminous type display has very advantageous characteristics that a further reduction in a thickness and a weight or a further decrease in power consumption is possible. Therefore, such a self-luminous type display has been actively studied and developed as a next-generation display.

Such a self-luminous type display is constituted of the display element and a display element drive circuit which is composed of a plurality of switching circuits which drive the display element in accordance with each display pixel constituting a display panel, and various drive methods in the display pixel drive circuit have been proposed.

FIG. 19 is a schematic block diagram showing a primary part of a conventional self-luminous type display. FIG. 20 is an equivalent circuit diagram showing a structural example of a display element drive circuit which is applicable to a display pixel in the conventional self-luminous type display.

As shown in FIG. 19, the conventional self-luminous type display generally includes a display panel 110P in which a plurality of display pixels EMp are arranged in a matrix form in the vicinity of respective intersections of a plurality of scanning lines (selection lines) SLp and data lines (signal lines) DLp respectively arranged in row and column directions. A scanning driver (a scanning drive circuit) 120P is connected with the scanning lines SLp. A data driver (a signal drive circuit) 130P is connected with the data lines DLp, and is configured to generate a gradation signal voltage Vpix corresponding to display data in the data driver 130O and supplies the generated voltage to each display pixel EMp through each data line DLp.

For example, as shown in FIG. 20, each display pixel EMp is configured to have a display element drive circuit DCp and an optical element (an organic EL element OEL). The display element drive circuit DCp includes: a first thin film transistor (TFT) Tr111 having a gate terminal connected with the scanning line SLp and having a source terminal and a drain terminal respectively connected with the data line DLp and a contact point N111; and a second thin film transistor Tr112 having a gate terminal connected with the contact point N111 and having a source terminal to which a ground potential Vgnd is applied. The optical element is provided which has an anode terminal connected with the drain terminal of the second transistor Tr112 in the display element drive circuit DCp and having a cathode terminal to which a low-power supply voltage Vss whose potential is lower than the ground potential Vgnd is applied.

Here, in FIG. 20, reference symbol CP1 denotes a parasitic capacitance (a retention volume) formed between gate and source electrodes of the second transistor Tr112. Further, the first thin film transistor Tr111 is constituted of an n-channel type field effect transistor, and the second thin film transistor Tr112 is constituted of a-p channel type field effect transistor.

In the display apparatus equipped with the display panel 110P constituted of the display pixels EMp having such a configuration, first, sequentially applying a scanning signal Vsel which is on a selection level (a high level) to the scanning line SLp in each row from the scanning driver 120P turns on the thin film transistor Tr111 of the display pixel EMp (the display element drive circuit DCp) in each row, thereby setting the display pixel EMp to a selection state.

In synchronization with this selection timing, when a gradation signal voltage Vpix corresponding to display data is generated by the data driver 130P and applied to the data line DLp in each column, the gradation signal voltage Vpix is applied to the contact point N111 (that is, the gate terminal of the thin film transistor Tr112) through the first transistor Tr111 of each display pixel EMp (the display element drive circuit DCp). As a result, the second transistor Tr112 is turned on in a conductive state corresponding to the gradation signal voltage Vpix, a predetermined driving current flows to the low-power supply voltage Vss from the ground potential Vgnd through the thin film transistor Tr112 and the organic EL element OEL. Thus, the organic EL element OEL operates to emit light with a luminance gradation corresponding to the display data.

Subsequently, when a scanning signal Vsel which is on a non-selection level (a low level) is applied to the scanning line SLp from the scanning driver 120P, the first transistor Tr111 of the display pixel EMp in each row is turned off, the display pixel EMp is set to a non-selection state, and the data line DLp and the display element drive circuit DCp are electrically disconnected. At this time, the second transistor Tr112 maintains the ON state based on the voltage applied to the gate terminal of the second transistor Tr112 and held in the parasitic capacitance Cp, and a predetermined driving current flows to the organic EL element OEL from the ground potential Vgnd through the first transistor Tr112 like the selection state, thereby maintaining the light emitting operation. This light emitting operation is controlled to continue for, e.g., one frame period until the gradation signal voltage Vpix corresponding to the next display data is applied to (written in) the display pixel EMp in each row.

Such a drive control method is referred to as a voltage specification mode (or a voltage application mode) since a current value of a driving current flowing through the organic EL element OEL is controlled to perform a light emitting operation with a predetermined luminance gradation by adjusting a voltage (the gradation signal voltage Vpix) applied to each display pixel EMp (the gate terminal of the thin film transistor Tr112 of the display element drive circuit DCp).

Meanwhile, in the display pixel EMp equipped with the display element drive circuit DCp adopting such a voltage specification mode, when irregularities or fluctuations (deterioration) are generated in element characteristics (a channel resistance or the like) of the first thin film transistor Tr111 having a selection function or the second thin film transistor Tr112 having a light emission drive function in dependence on an external environment (an ambient temperature or the like), an operating time or the like, a driving current supplied to the display element (the organic EL element OEL) fluctuates, and there is a problem that it is difficult to stably realize desired light emission characteristics (display with a predetermined luminance gradation) for a long time.

Further, when each display pixel is miniaturized in order to achieve high definition, irregularities in operation characteristics (a current between the source and the drain or the like) of both transistors Tr111 and Tr112 constituting the display element drive circuit DCp become large. Therefore, an appropriate gradation control cannot be performed, and irregularities are produced in light emission characteristics of each display pixel, thereby resulting in deterioration of a display image quality.

Thus, as a configuration which solves such problems, there has been known a configuration of a display element drive circuit corresponding to a drive control method called a current application mode (or a current specification mode). Although a concrete structural example of the display element drive circuit of the display pixel corresponding to this current application mode will be explained in detail in conduction with the later-described embodiments according to the present invention, this circuit generally has the following configuration and operation (function).

For example, the element drive circuit corresponding to the current application mode is provided with at least a write control circuit which controls writing a gradation signal current corresponding to display data into the display element drive circuit; and a driving current control circuit which controls a current value of a driving current supplied to the display element and its supply state based on a voltage component corresponding to the written gradation signal current. The element drive circuit is configured to fetch the gradation signal current having a current value corresponding to display data with a timing at which a selection state is set by application of a scanning signal having a selection level to the write control circuit, hold the fetched signal as a voltage component by the driving current control circuit, and supply a driving current having a current value based on the voltage component to the display element in a non-selection state. Consequently the display element is operated to continuously emit light with a predetermined luminance gradation.

In such a configuration, the driving current control circuit has a function of converting a current level of a gradation signal current corresponding to display data supplied to each display pixel into a voltage level and a function of supplying a driving current having a predetermined current value based on the voltage level to the display element. Thus, there is an advantage that the driving current supplied to the display element can be prevented from being fluctuated and deterioration of a display image quality can be suppressed by constituting the driving current control circuit of a single active element (the thin film transistor) even if characteristics of the thin film transistor fluctuate.

However, the display element drive circuit adopting the current application mode has the following problems.

In the display element drive circuit adopting the current specification mode, the operation of writing a gradation signal current corresponding to display data in each display pixel corresponds to charging a capacitance component such as a wiring capacitance which is parasitic on a data line, a retention volume or a parasitic capacitance provided in the display element drive circuit of each display pixel to a predetermined voltage.

Therefore, since such a capacitance component exists, it takes time to some extent until the write operation is completed and a current value of the gradation signal current becomes relatively small at the time of a low gradation in particular. Therefore, an operation is delayed or insufficient writing occurs, whereby the display element cannot perform the light emitting operation with an appropriate luminance gradation corresponding to display data in some cases.

Furthermore, various kinds of capacitance components existing in the display element drive circuit of the display pixel have the following problem. For example, a fluctuation is generated in a control voltage which turns on a switching element (a thin film transistor) constituting the driving current control circuit by capacitance coupling between respective electrodes of a transistor constituting the display element drive circuit or between an electrode and a wiring portion, a fluctuation is further produced in a current value of a driving current supplied to the display element with respect to a specified current value of a gradation signal current, and the display element cannot perform the light emitting operation with an appropriate luminance gradation corresponding to display data. As a result, contrast is lowered to deteriorate a display image quality, for example. An influence of the various capacitance components in a concrete circuit configuration will be explained in detail in conjunction with later-described embodiments according to the present invention.

BRIEF SUMMARY OF THE INVENTION

In a display apparatus provided with a display panel which has a display element and a display element drive circuit which drives the display element in a display pixel, the present invention has an advantage of improving a display image quality while suppressing occurrence of a delay of a write operation, insufficient writing, deterioration of luminance characteristics and the like due to a parasitic capacitance or a retention volume caused by a plurality of transistors constituting the display element drive circuit.

In order to obtain the above-described advantage, a display element drive circuit according to the present invention comprises a display element drive circuit comprising:

an electric charge holding circuit which holds as a voltage component electric charges based on a gradation signal corresponding to display data;

a write control circuit which supplies the gradation signal to the electric charge holding circuit at a timing of application of a selection signal;

a current control type display element; and a driving current control circuit which generates a driving current based on the voltage component held in the electric charge holding circuit and supplies the generated driving current to the display element, wherein at least one of the write control circuit and the driving current control circuit includes at least one field effect transistor, said at least one field effect transistor comprises a gate electrode, a source electrode and a drain electrode, and a source-side parasitic capacitance is formed between the gate electrode and the source electrode of said one field effect transistor and a drain-side parasitic capacitance is formed between the gate electrode and the drain electrode of said one field effect transistor, the source-side parasitic capacitance and the drain-side parasitic capacitance having different capacitance values.

Said at least one electric field transistor has an element configuration including a semiconductor layer formed of, e.g., amorphous silicon.

Preferably, the gradation signal is a gradation signal current having a current value corresponding to a luminance gradation of the display data, and each of the display elements comprises a light emitting element which operates to emit light with a predetermined luminance gradation in accordance with the current value of the driving current, and it is, e.g., an organic electroluminescent element.

Said at least one electric field transistor may maintain characteristics of a current value of a current flowing through a current path between the source electrode and the drain electrode with respect to a voltage value of a voltage applied to the gate electrode when both the source-side parasitic capacitance formed between the gate electrode and the source electrode and the drain-side parasitic capacitance formed between the gate electrode and the drain electrode have a predetermined capacitance value, and one of the source-side parasitic capacitance and the drain-side parasitic capacitance has a value larger than the predetermined capacitance value, whilst the other thereof has a value smaller than the predetermined capacitance value.

A planar shape of each of the source electrode and the drain electrode of said at least one electric field transistor may be asymmetrical, a gate width of the gate electrode on the source electrode side is different from a gate width of the gate electrode on the drain electrode side, each of opposite sides of the source electrode and the drain electrode of said at least one electric field transistor has a circular arc shape, and the gate electrode has a circular arc strip-like planar shape. Alternatively, each of opposite sides of the source electrode and the drain electrode of said at least one electric field transistor has a linear shape, and the gate electrode has a rectangular planar shape.

Said at least one electric field transistor may be a transistor in which the gradation signal is supplied to the drain electrode and the selection signal is applied to the gate electrode in the write control circuit, and the drain-side parasitic capacitance is set to a value smaller than a capacitance value of the source-side parasitic capacitance.

Alternately, said at least one field effect transistor may be a transistor in which a predetermined power supply voltage is applied to the drain electrode and the selection signal is applied to the gate electrode in the write control circuit, and the source-side parasitic capacitance is set to a value smaller than a capacitance value of the drain-side parasitic capacitance.

Alternately, said at least one field effect transistor may be a transistor in which a predetermined power supply voltage is applied to the drain electrode and the selection signal is applied to the gate electrode in the write control circuit, and the source-side parasitic capacitance is set to a value larger than a capacitance value of the drain-side parasitic capacitance.

Further, the write control circuit may comprise: a first transistor constituted of the field effect transistor in which a predetermined power supply voltage is applied to one end side of a current path formed between the source electrode and the drain electrode and the selection signal is applied to the gate electrode; and a second transistor constituted of the field effect transistor in which the gradation signal is supplied to one end side of a current path formed between the source electrode and the drain electrode and the selection signal is applied to the gate electrode, said at least one field effect transistor of the driving current control circuit comprises a third transistor constituted of the field effect transistor in which a predetermined power supply voltage is applied to one end side of a current path formed between the source electrode and the drain electrode, one end side of the display element is connected with the other end side of the current path and a control signal generated by the write control circuit is applied to the gate electrode, and the driving current control circuit supplies a current flowing through the current path of the third transistor to the display element as the driving current, and the electric charge holding circuit comprises a capacitance element connected between the gate electrode of the third transistor and the other end side of the third current path.

In order to obtain the above-described advantage, a display apparatus which displays image information, according to the present invention comprises:

a display panel having: a plurality of scanning lines and a plurality of signal lines arranged to be orthogonal to each other; and a plurality of display pixels arranged in the vicinity of respective intersections of the respective scanning lines and signal lines, wherein each of the display pixels comprises a current control type display element and a display element drive circuit which controls a light emitting operation of the display element, a display element drive circuit comprising:

an electric charge holding circuit which holds as a voltage component electric charges based on a gradation signal corresponding to display data;

a write control circuit which supplies the gradation signal to the electric charge holding circuit at a timing of application of a selection signal;

a plurality of current control type display elements; and a driving current control circuit which generates a driving current based on the voltage component held in the electric charge holding circuit and supplies the generated driving current to the display element, wherein at least one of the write control circuit and the driving current control circuit includes at least one field effect transistor, said at least one field effect transistor comprises a gate electrode, a source electrode and a drain electrode, and a source-side parasitic capacitance is formed between the gate electrode and the source electrode of said at least one field effect transistor and a drain-side parasitic capacitance is formed between the gate electrode and the drain electrode of said at least one field effect transistor, the source-side parasitic capacitance and the drain-side parasitic capacitance having different capacitance values.

Each electric field effect transistor may have an element configuration provided with a semiconductor layer formed of, e.g., amorphous silicon.

The display element may be a light emitting element which operates to emit light with a predetermined luminance gradation in accordance with a current value of the driving current, and it is, e.g., an organic electroluminescent element.

Said at least one field effect transistor, preferably maintains characteristics of a current value of a current flowing in a current path between the source electrode and the drain electrode with respect to a voltage value of a voltage applied to the gate electrode when both the source-side parasitic capacitance formed between the gate electrode and the source electrode and the drain-side parasitic capacitance formed between the gate electrode and the drain electrode have a predetermined capacitance value, and one of the source-side parasitic capacitance and the drain-side parasitic capacitance has a value larger than the predetermined capacitance value, whilst the other thereof has a value smaller than the predetermined capacitance value.

Preferably, a planar shape of each of the source electrode and the drain electrode of said at least one field effect transistor is asymmetrical, a gate width of the gate electrode on the source electrode side is different from a gate width of the gate electrode on the drain electrode side, each of opposite sides of the source electrode and the drain electrode of said at least one field effect transistor has a circular arc shape, and the gate electrode has a circular arc strip-like planar shape. Alternatively, each of opposite sides of the source electrode and the drain electrode of said at least one field effect transistor may have a linear shape, and the gate electrode has a rectangular planar shape.

The display apparatus may further comprises:

a scanning drive circuit which sequentially applies the selection signal to each of the plurality of scanning lines in the display panel to set a selection state in which the gradation signal is written in the display pixel corresponding to each of the scanning lines; and a signal drive circuit which generates the gradation signal corresponding to the display pixel set in the selection state in accordance with the display data, and supplies the generated gradation signal to the plurality of signal lines.

The gradation signal supplied from the signal drive circuit is a gradation signal current having a current value corresponding to a luminance gradation of the display data.

Preferably, said at least one field effect transistor is a transistor in which the gradation signal is supplied to the drain electrode and the selection signal is applied to the gate electrode in the write control circuit, and the drain-side parasitic capacitance is set to a value smaller than a capacitance value of the source-side parasitic capacitance. Alternatively, said at least one field effect transistor may be a transistor in which a predetermined power supply voltage is applied to the drain electrode and the selection signal is applied to the gate electrode in the write control circuit, and the source-side parasitic capacitance is set to a value smaller than a capacitance value of the drain-side parasitic capacitance. Alternatively, said one field effect transistor may be a transistor in which a predetermined power supply voltage is applied to the drain electrode and the selection signal is applied to the gate electrode in the write control circuit, and the source-side parasitic capacitance is set to a value larger than a capacitance value of the drain-side parasitic capacitance. Alternatively, said at least one field effect transistor may be a transistor in which a predetermined power supply voltage is applied to the drain electrode, one end side of the display element is connected with the source electrode and a control signal generated by the write control circuit is applied to the gate electrode to supply the driving current to the display element in the driving current control circuit, and the source-side parasitic capacitance is set to a value larger than a capacitance value of the drain-side parasitic capacitance.

The write control circuit may include: a first transistor constituted of the field effect transistor in which a predetermined power supply voltage is applied to one end side of a current path formed between the source electrode and the drain electrode; and a second transistor constituted of the field effect transistor in which the gradation signal is supplied to one end side of a current path formed between the source electrode and the drain electrode and the selection signal is applied to the gate electrode, the driving current control circuit comprises a third transistor constituted of the field effect transistor in which a predetermined power supply voltage is applied to one end side of a current path formed between the source electrode and the drain electrode and the selection signal is applied to the gate electrode, one end side of the display element is connected to the other end side of the current path and a control signal generated by the write control circuit is applied to the gate electrode, and the driving current control circuit supplies a current flowing through the current path of the third transistor to the display element as the driving current, and the electric charge holding circuit comprises a capacitance element connected between the control terminal of the third transistor and the other end side of the current path.

BRIEF DESCRIPTION OF THE SEVERAL VIEWS OF THE DRAWING

FIG. 5 is a timing chart showing a basic operation of the display pixel to which the display element drive circuit according to this circuit example is applied;

DETAILED DESCRIPTION OF THE INVENTION

A display element drive circuit and a display apparatus provided with the display element drive circuit in a display pixel according to the present invention will now be described hereinafter in detail based on illustrated embodiments.

<Display Apparatus>

A schematic configuration of a display apparatus according to the present invention will be first described with reference to the accompanying drawings.

Figure 1:
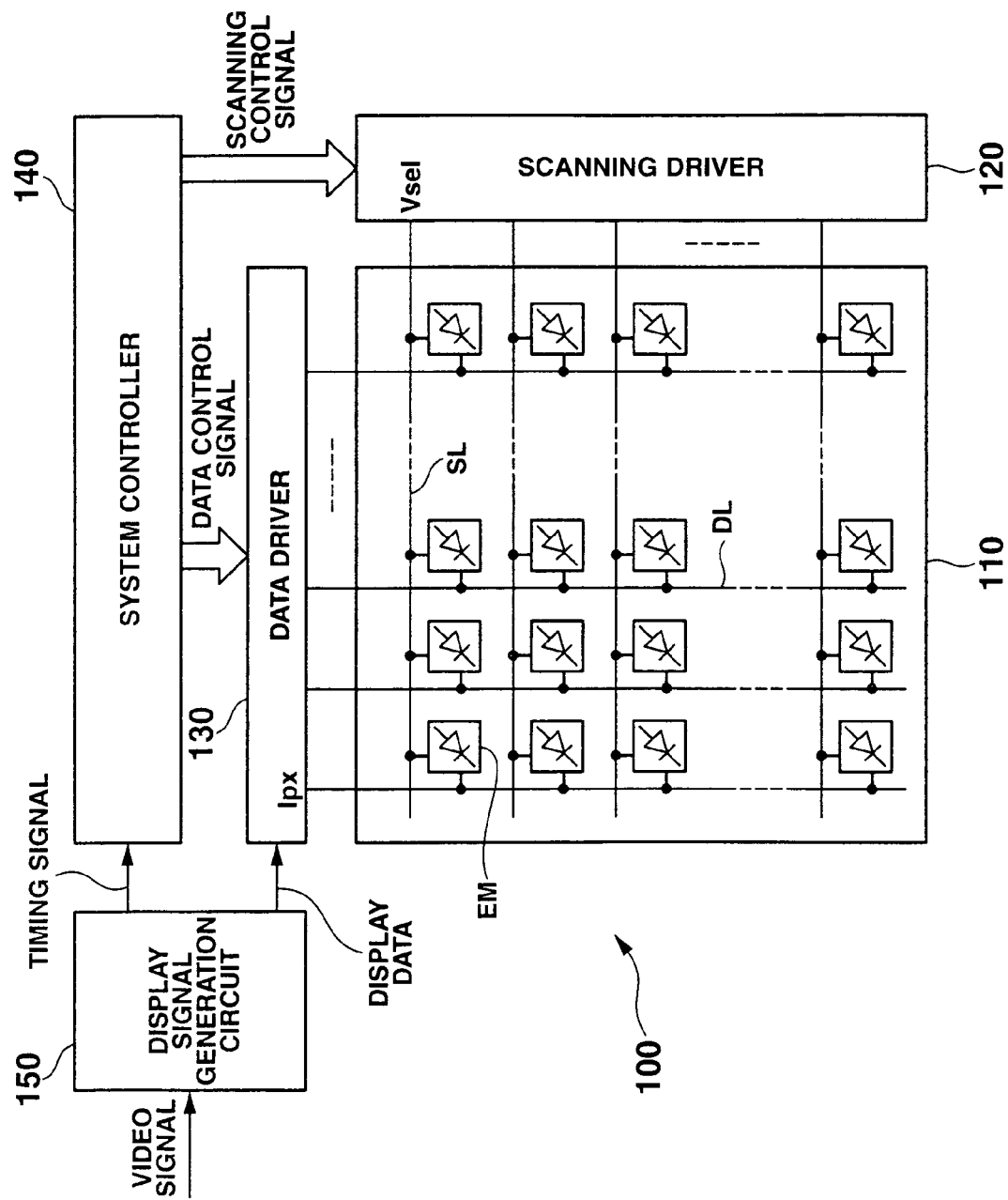
FIG. 1 is a schematic block diagram showing a basic configuration of a display apparatus according to the present invention.

FIG. 1 is a schematic block diagram showing a basic configuration of a display apparatus according to the present invention.

Figure 2:
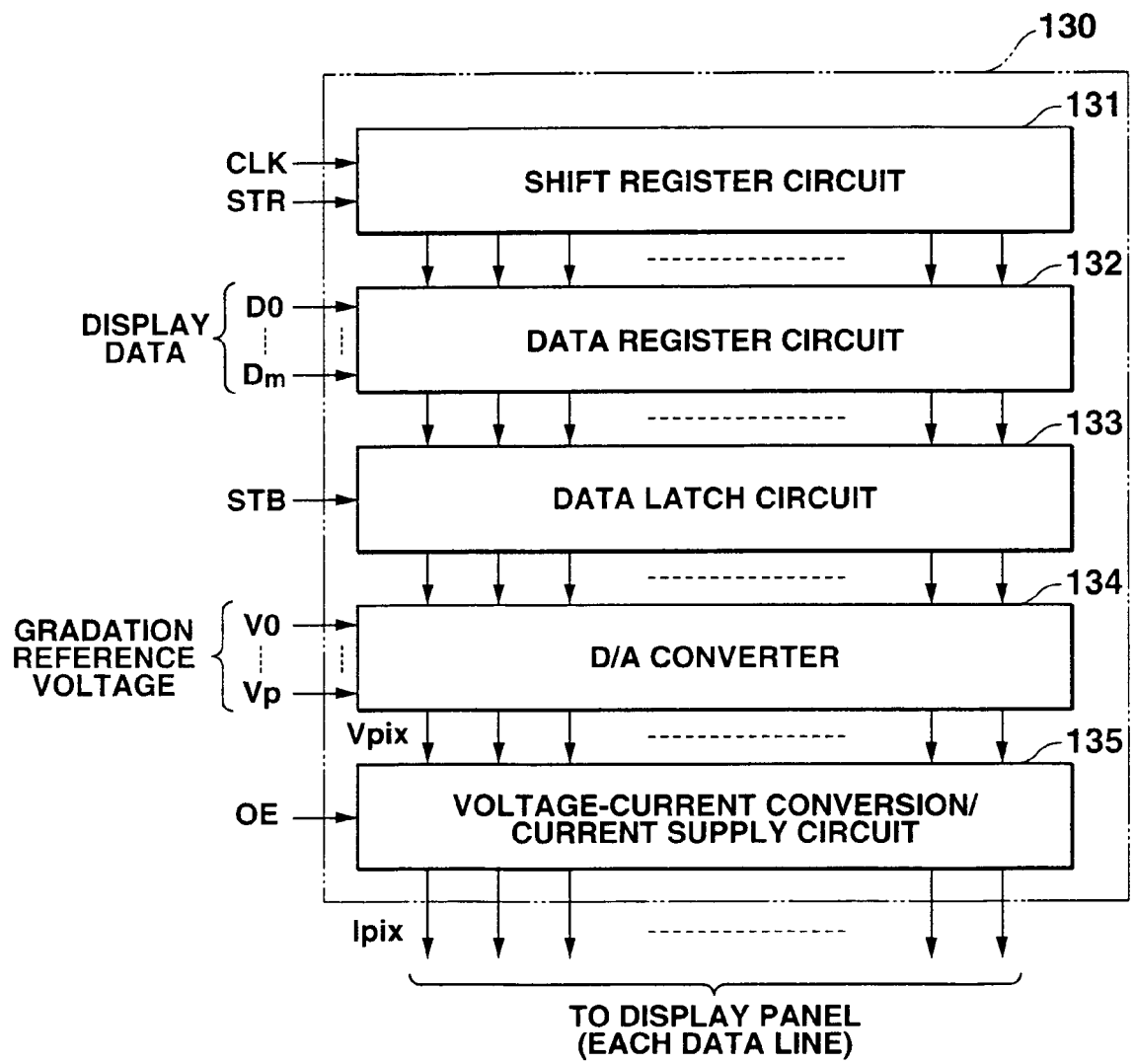
FIG. 2 is a schematic block diagram showing an example of a data driver which is applicable to the display apparatus according to the present invention.

FIG. 2 is a schematic block diagram showing an example of a data driver which is applicable to the display apparatus according to the present invention.

Here, the display apparatus having a configuration corresponding to a drive control method adopting a current application mode will be described.

As shown in FIG. 1, a display apparatus 100 according to an embodiment of the present invention generally is constituted of a display panel 110 in which a plurality of display pixels EM are arranged in a matrix form in the vicinity of respective intersections of a plurality of scanning lines SL and a plurality of data lines (signal lines) DL respectively extending in a row direction and a column direction and arranged to be orthogonal to each other. Each of the display pixel EM includes a light emitting element (an organic EL element), and a later-described display element drive circuit. The apparatus 100 further comprises a scanning driver (a scanning drive circuit) 120 which is connected with the scanning lines SL of the display panel 110 and sets (scans) the display pixels EM in each row to a selection state by sequentially applying a scanning signal (a selection signal) Vsel to the scanning line SL at a predetermined timing, and a data driver (a signal drive circuit) 130 which is connected with the data lines DL of the display panel 110 and generates a gradation signal current Ipix based on display data to be supplied to the data line DL. The apparatus also includes a system controller 140 which generates and outputs a scanning control signal and a data control signal which control operating states of at least the scanning driver 120 and the data driver 130, and a display signal generation circuit 150 which generates display data (a display signal) comprising a digital signal based on a video signal fed from the outside of the display apparatus 100, supplies the generated signal to the data driver 130, extracts or generates a timing signal (a system clock or the like) which is used to display predetermined image information in the display panel 110 based on the display data and supplies the extracted or generated signal to the system controller 140.

(Display Panel)

Each of the light emitting element is formed by a current control type display element the display element drive circuit selectively executes a write operation of fetching a gradation signal current Ipix and holding it as a voltage component, based on a scanning signal Vsel applied to the scanning line SL from the scanning driver 120 and the gradation signal current Ipix supplied to the data line DL from the signal driver 130, and a light emitting operation of supplying a driving current having a predetermined current value based on the voltage component to the display element to emit light with a predetermined luminance gradation. A concrete structural example of the display element drive circuit which is applicable to the present invention will be described later.

(Scanning Driver)

The scanning driver 120 sequentially applies the scanning signal Vsel which is on a selection level (e.g., a high level) to each scanning line SL based on a scanning control signal supplied from the system controller 140 to set the display pixel EM in each row to the selection state, and controls the gradation current Ipix based on the display data fed from the data driver 130 through each data line DL to be written in each display pixel EM (the display element drive circuit).

Here, the scanning driver 120 has a configuration in which a plurality of shift blocks each including a shift register and a buffer are provided in accordance with the respective scanning lines SL, and a shift signal is sequentially shifted by the shift register based on a scanning control signal (a scanning start signal, a scanning clock signal or the like) supplied from the later-described system controller 140 while the shift signal in each stage (each row) is converted into a predetermined voltage level (a high level) through the buffer so that the converted signal is sequentially output to each scanning line SL as the scanning signal Vsel.

(Data Driver)

The data driver 130 fetches and holds display data supplied from the display signal generation circuit 150 at a predetermined timing based on a data control signal fed from the system controller 140, generates a gradation current Ipix having a current value corresponding to a gradation value of the display data, and then supplies the generated gradation current Ipix to each data line within a selection period set for each scanning line SL.

Here, specifically, for example, as shown in FIG. 2, the data driver 130 is configured to have a shift register circuit 131, a data register circuit 132, a data latch circuit 133, a D/A converter 134, and a voltage-current conversion/current supply circuit 135. The shift register circuit 131 sequentially outputs a shift signal based on a data control signal (a shift clock signal CLK, a sampling start signal STR) supplied from the system controller 140. The data register circuit 132 sequentially fetches display data D0 to Dm corresponding to one row supplied from the display signal generation circuit 150 based on an input timing of the shift signal. The data latch circuit 133 holds the display data D0 to Dm corresponding to one row fetched by the data register circuit 132 based on a data control signal (a data latch signal STB). The D/A converter (a digital/analog converter) 134 converts the held display data D0 to Dm into a predetermined analog signal voltage (the gradation voltage Vpix) based on gradation reference voltages V0 to Vp fed from an external power supply circuit. The voltage-current conversion/current supply circuit 135 generates a gradation signal current Ipix having a current value corresponding to display data converted into an analog signal voltage (corrected display data) and simultaneously supplies the gradation signal current Ipix to the respective display pixels EM through the data lines DL at a timing based on a data control signal (an output enable signal OE) fed from the system controller 140.

(System Controller 140)

The system controller 140 generates and outputs a scanning control signal and a data control signal with to at least the scanning driver 120 and the data driver 130 based on, e.g., a timing signal supplied from the display signal generation circuit 150 to operate each driver at a predetermined timing, so that the scanning signal Vsel and the gradation signal current Ipix are generated, and applies the generated signals to each scanning line SL and data line DL to continuously execute a light emitting operation in each display pixel EM so that image information based on a video signal is displayed in the display panel 110.

(Display Signal Generation Circuit 150)

The display signal generation circuit 150 extracts a luminance gradation signal component from, e.g., a video signal fed from the outside of the display apparatus 100, and supplies the luminance gradation signal component to the data driver 130 as display data comprising a digital signal in accordance with each row of the display panel 110. Here, where the video signal includes a timing signal component which defines a display timing of image information like a television broadcast signal (a composite video signal), the display signal generation circuit 150 may have a function of extracting the luminance gradation signal component as well as a function of extracting the timing signal component and supplies it to the system controller 140 as shown in FIG. 1. In this case, the system controller 140 generates a scanning control signal and a data control signal which are individually supplied to the scanning driver 120 and the data driver 130 based on a timing signal fed from the display signal generation circuit 150.

Alternately, where the video signal is formed of a digital signal and also the timing signal is supplied separately from the video signal, the video signal (the digital signal) is fed to the data driver 130 as display data, and the timing signal is directly supplied to the system controller 140. Thus the display signal generation circuit 150 can be eliminated.

<Display Pixel>

A concrete circuit example of the display element drive circuit in each of the display pixels of the display panel which is applied to the display apparatus according to this embodiment will now be described in detail with reference to the accompanying drawings.

Figure 3:
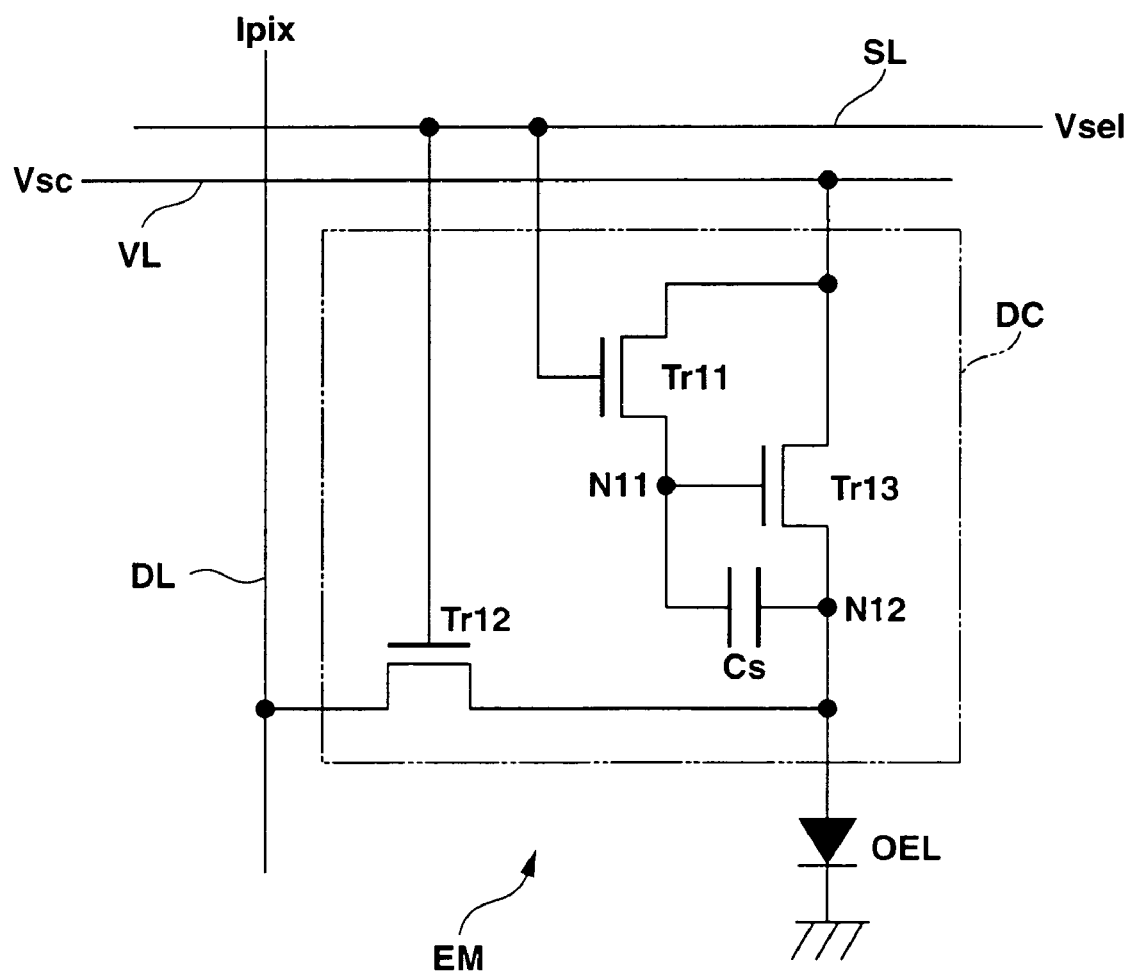
FIG. 3 is a circuit configuration view showing a concrete circuit example of a display element drive circuit which is applicable to a display pixel in the display apparatus according to the present invention.

FIG. 3 is a circuit configuration view showing a concrete circuit example of the display element drive circuit which is applicable to the display pixel in the display apparatus according to the present invention.

Figure 4A:
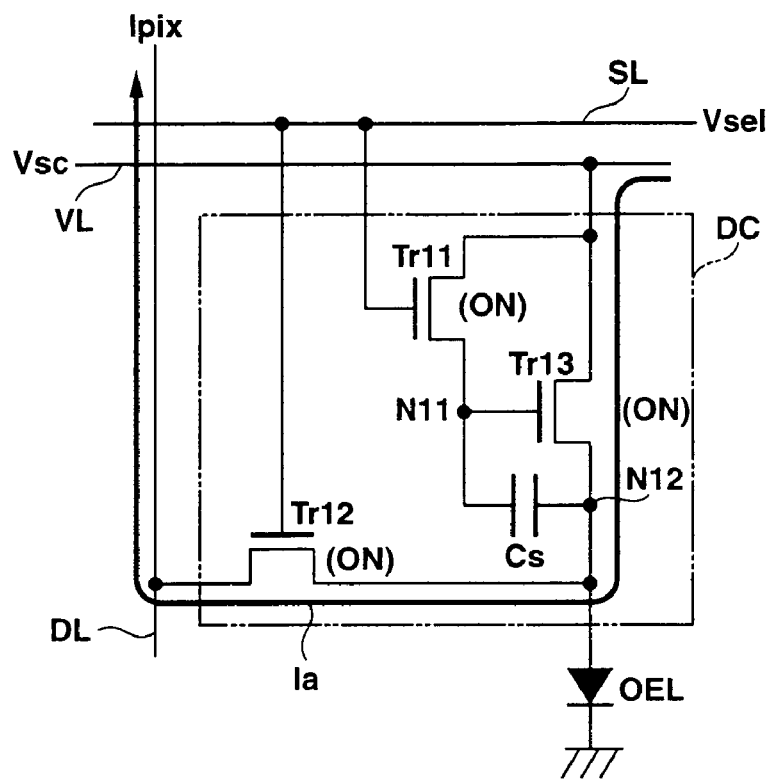
FIGS. 4A and 4B are views showing operating states of the display element drive circuit according to this circuit example.
Figure 4B:
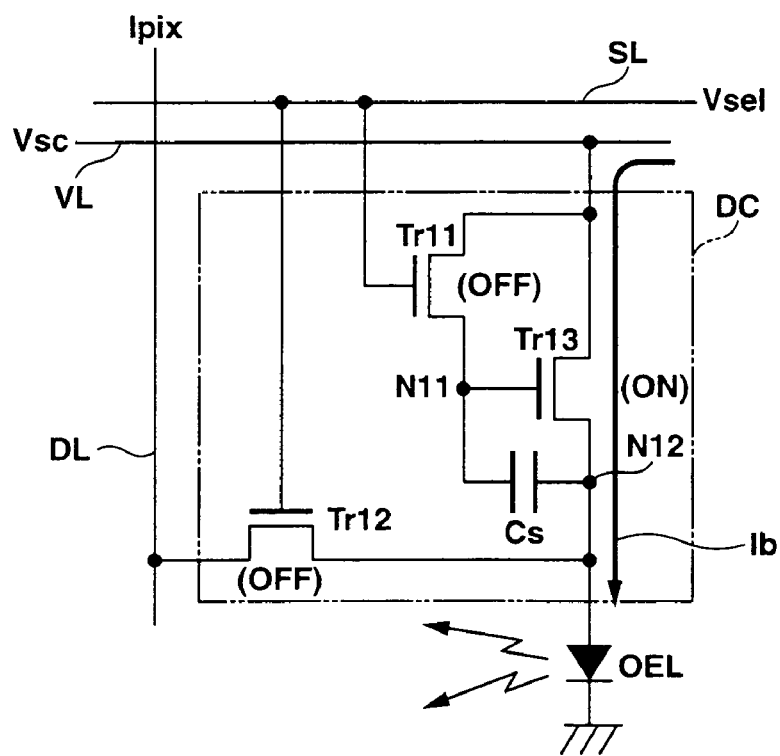

FIGS. 4A and 4B are conceptual views showing operating states of the display element drive circuit according to this circuit example;

FIG. 5 is a timing chart showing a basic operation of the display pixel to which the display element drive circuit according to this circuit example.

FIG. 5 shows drive control operations in the display pixels in an ith row and an i+1th row and a jth column in the display panel. Here, i and j are arbitrary positive integers which specify display pixels in the display panel.

As shown in FIG. 3, the display pixel EM according to this embodiment is configured to have, e.g., a display element drive circuit DC and an organic EL element (the display element) OEL in the vicinity of each intersection of the scanning line (the selection line) SL and the data line DL arranged to be orthogonal to each other in the display panel 110. The circuit DC includes first to third thin film transistors Tr11, Tr12, Tr13. The first transistor Tr11 has a gate terminal connected with the scanning line SL, and source and drain terminals respectively connected with a power supply line VL (an anode line; a power supply voltage Vsc) and a contact point N11. The second transistor Tr12 has a gate terminal connected with the scanning line SL, and source and drain terminals respectively connected with the data line DL and a contact point N12. The first and second transistors Tr11, Tr12 constitute a write control circuit. The third transistor Tr13 has a gate terminal connected with the contact point N11, and source and drain terminals respectively connected with the power supply line VL and the contact point N12. The third transistor Tr13 constitutes a light emission control circuit. The drive circuit DC further comprises an electric charge holding circuit including a capacitor (a capacitance element) Cs connected between the contact point N11 and the contact point N12. The display pixel EM also includes the organic EL element OEL having an anode terminal connected with the contact point N12 of the display element drive circuit DC, and a cathode terminal connected with a ground potential. The capacitor Cs may be a parasitic capacitance formed between the gate and the source of the thin film transistor Tr13.

Here, although the thin film transistors Tr11 to Tr13 applied to the display element drive circuit DC according to this embodiment are not restricted in particular, an field effect transistor comprising a semiconductor layer formed of n-channel type amorphous silicon can be excellently applied by constituting all the thin film transistors Tr11 to Tr13 by using n channel type thin film transistors. In this case, a simplified amorphous silicon manufacturing technology can be applied to relatively inexpensively manufacture the display element drive circuit having stable operating characteristics.

In this embodiment, in the display element drive circuit DC having the above-described circuit configuration, at least one of the first to third thin film transistors Tr11 to Tr13 has an element configuration specific to the present invention, and a parasitic capacitance formed between the gate electrode and the source electrode of this thin film transistor (a source-side parasitic capacitance) and a parasitic capacitance formed between the gate electrode and the drain electrode of the same (a drain-side parasitic capacitance) are set to have different capacitance values. The element configuration and a condition setting of the parasitic capacitance of the thin film transistor will be described later in detail.

For example, as shown in FIG. 5, a drive control method (a light emission drive control) of the display element (the organic EL element OEL) in the display element drive circuit DC having such a configuration is executed by effecting a setting to include a write operation period (a selection period) Tse and a light emitting operation period (a non-selection period) Tnse. In the write operation period Tse, one scanning period Tsc is determined as one cycle, the display pixel EM connected with the scanning line SL is selected, and the gradation signal current Ipix corresponding to display data is written and held as a voltage component within one scanning period Tsc. In the light emitting operation period Tnse, a driving current corresponding to the display data is generated and supplied to the organic EL element based on the voltage component written and held in the write operation period Tse so that the light emitting operation is performed with a predetermined luminance gradation (Tsc≧Tse+Tnse). Here, the write operation period Tse which is set in accordance with the scanning line SL in each row is set in such a manner that a temporal overlap is not generated.

(Write Operation Period)

In the write operation period Tse of the display pixel EM, as shown in FIG. 5, the high-level scanning signal Vsel is first applied to a specific scanning line SL from the scanning driver 120 so that the display pixel EM in this row is set to a selection state, and the low-level power supply voltage Vsc is applied to the power supply line VL of the display pixel EM in this row. Further, in synchronization with this timing, a gradation signal current with a negative polarity (−Ipix) having a current value based on display data corresponding to each display pixel in this row is supplied to each data line DL from the data driver 130.

As a result, the first and second transistors Tr11 and Tr12 constituting the display element drive circuit DC are turned on, the low-level power supply voltage Vsc is applied to the contact point N11 (that is, the gate terminal of the thin film transistor Tr13 and one end side of the capacitor Cs), and an operation of drawing the gradation signal current with the negative polarity (−Ipix) is performed by the data driver 130 through the data line DL. As a result, a voltage level having a potential lower than the low-level power supply voltage Vsc is applied to the contact point N12 (that is, the source terminal of the thin film transistor Tr13 and the other end of the capacitor Cs).

When a potential difference is generated between the contact points N11 and N12 (between the gate and the source of the third transistor Tr13) in this manner, the thin film transistor Tr13 is turned on, and a write current Ia corresponding to a current value of the gradation signal current Ipix flows to the data driver 130 from the power supply line VL through the third transistor Tr13, the contact point N12, the second transistor Tr12 and the data line DL as shown in FIG. 4A.

At this time, electric charges corresponding to the potential difference generated between the contact points N11 and N12 (between the gate and the source of the thin film transistor Tr13) are stored in the capacitor Cs, and held (charged) as a voltage component. Furthermore, a power supply voltage Vsc having a voltage level equal to or lower than the ground potential is applied to the power supply line VL, and the write current Ia is controlled to flow in a direction of the data line DL. Therefore, a potential applied to the anode terminal (the contact point N12) of the organic EL element OEL becomes lower than a potential (the ground potential) of the cathode terminal of the same, and a reverse bias voltage is applied to the organic EL element OEL. Therefore, the driving current does not flow through the organic EL element OEL, and hence the light emitting operation is not carried out.

(Light Emitting Operation Period)

Subsequently, in the light emitting operation period Tnse after end of the write operation period Tse, as shown in FIG. 5, the low-level scanning signal Vsel is applied from the scanning driver 120 to the scanning line SL where the write operation has been performed so that the display pixel EM is set to a non-selection state, and the high-level power supply voltage Vsc is applied to the power supply line VL of the display pixel EM in this row. Moreover, in synchronization with this timing, the operation of drawing the gradation current Ipix by the data driver (an operation of supplying the gradation signal current Ipix with the negative polarity) is stopped.

As a result, the thin film transistors Tr11 and Tr12 constituting the display element drive circuit DC are turned off, application of the power supply voltage Vsc to the contact point N11 (that is, the gate terminal of the thin film transistor Tr13 and one end side of the capacitor Cs) is interrupted, and application of the voltage level due to the operation of drawing the gradation signal current Ipix to the contact point N12 (that is, the source terminal of the thin film transistor Tr13 and the other end side of the capacitor Cs) by the data driver 130 is interrupted. Therefore, the capacitor Cs holds the electric charges stored in the write operation period.

When the capacitor Cs holds the charging voltage in the write operation in this manner, the potential difference between the contact points N11 and N12 (between the gate and the source of the thin film transistor Tr13) is held, and the thin film transistor Tr13 maintains the ON state. Additionally, since the power supply voltage Vsc having a voltage level higher than the ground potential is applied to the power supply line VL, the potential applied to the anode terminal (the contact point N12) of the organic EL element OEL becomes higher than the potential (the ground potential) of the cathode terminal.

Therefore, as shown in FIG. 4B, a predetermined driving current (an output current Ib) flows to the organic EL element OEL from the power supply line VL through the third transistor Tr13 and the contact point N12 in a forward bias direction so that the organic EL element OEL emits light. Here, since the potential difference (the charging voltage) based on the electric charges stored in the capacitor Cs corresponds to a potential difference when the write current Ia corresponding to the gradation signal current Ipix is allowed to flow in the thin film transistor Tr13, the driving current Ib supplied to the organic EL element OEL has a current value equivalent to the write current Ia. As a result, in the non-selection period Tnse after the write operation period Tse, the driving current Ib is continuously supplied through the third transistor Tr13 based on the voltage component corresponding to the display data (the gradation signal current Ipix) written in the write operation period, and the organic EL element OEL continues the operation to emit light with a luminance gradation corresponding to the display data.

When the above-described series of operations are sequentially repeatedly executed with respect to all the scanning lines SL constituting the display panel 110, display data corresponding to one screen in the display panel is written, and light is emitted with a predetermined luminance gradation, thereby displaying desired image information.

Here, in the display element drive circuit DC according to this embodiment, as described above (see FIG. 5), the power supply voltage Vsc having a predetermined voltage value must be applied to the power supply line VL. As a configuration which realizes this application, for example, in addition to the configuration of the display apparatus 100 shown in FIG. 1, it is possible to apply a configuration which comprises a power supply driver connected with the plurality of power supply lines VL arranged in parallel with the respective scanning liens SL in the display panel 110, and applies the power supply voltage Vsc having a predetermined voltage value from the power supply driver to the power supply line VL in a row to which the scanning signal Vsel is applied by the scanning driver 120 (the display pixel EMB set to the selection state) based on a power supply control signal fed from the system controller 140 at a timing synchronized with the scanning signal Vsel output from the scanning driver 120.

Alternately, a configuration may be made in which the scanning signal (or a shift output signal which is used to generate a scanning signal) is subjected to reversal processing in the scanning driver 120 to be amplified to have a predetermined signal level and applied to each power supply line VL as the power supply voltage Vsc since the power supply voltage Vsc is applied to the power supply line VL at a timing synchronized with the scanning signal Vsel output from the scanning driver 120.

In the above-described display pixel, the description has been given as to the circuit configuration which comprises the three thin film transistors having the same channel polarity, generates the gradation signal current with the negative polarity by the data driver and draws the gradation signal current from the display pixel (the display element drive circuit) through the data line in a direction of the data driver as an example of the display element drive circuit corresponding to the current application mode the present invention, however is not restricted thereto.

That is, the display pixel may have any other circuit configuration as long as it comprises a thin film transistor (the driving current control circuit) having at least a function of holding a voltage component corresponding to a gradation signal based on display data, generating a driving current based on the voltage component and supplying it to the current control type display element. For example, it may have a circuit configuration comprising four thin film transistors. Additionally, it may have a circuit configuration corresponding to a conformation which generates a gradation current with a positive polarity by the data driver and allows the gradation current to flow from the data driver in a direction of the display pixel (the display element drive circuit) through the data line.

In the above-described display pixel, although the description has been given as to the configuration in which the organic EL element is applied as the light emitting element constituted of the current control type display element, the present invention is not restricted thereto. For example, a light emitting diode or any other light emitting element may be applied as long as it is a light emitting element which operates to emit light with a predetermined luminance gradation in accordance with a current value of a driving current supplied thereto.

<Examination of Parasitic Capacitance in Display Element Drive Circuit>

Here, a connection state of each capacitance component (a retention volume and a parasitic capacitance) in the display element drive circuit having the above-described circuit configuration will now be examined in detail.

Figure 6A:
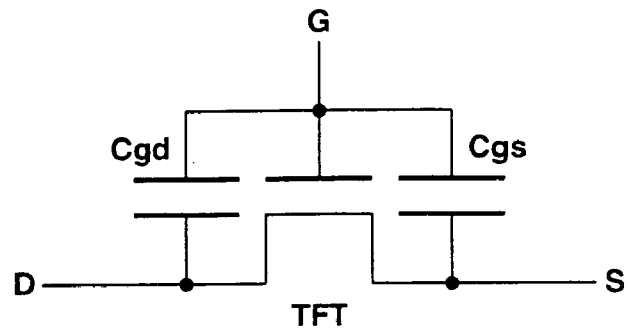
FIGS. 6A and 6B are views showing a connection state of a capacitance component in the display element drive circuit depicted in FIG. 3.
Figure 6B:
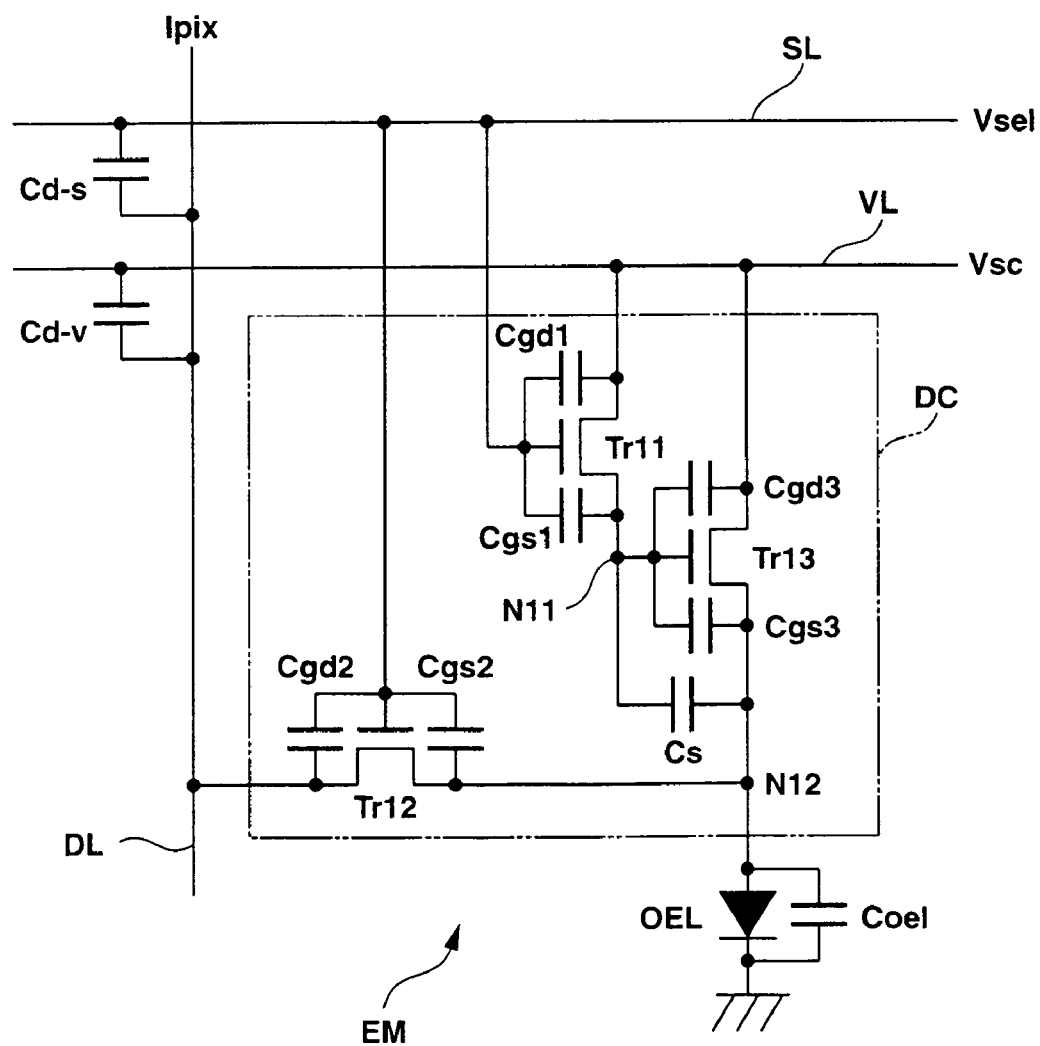

FIGS. 6A and 6B are conceptual views showing connection states of the capacitance component in the display element drive circuit depicted in FIG. 3.

Figure 7A:
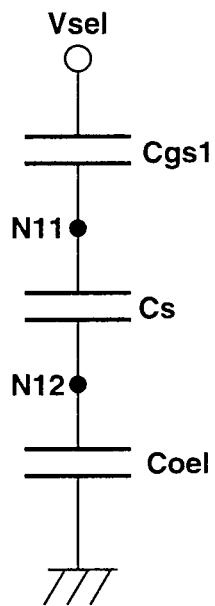
FIGS. 7A, 7B and 7C are views illustrating an influence of a parasitic capacitance formed in the display element drive circuit.
Figure 7B:
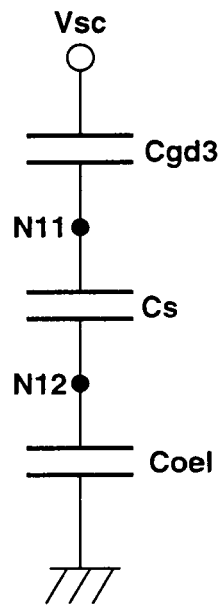
Figure 7C:
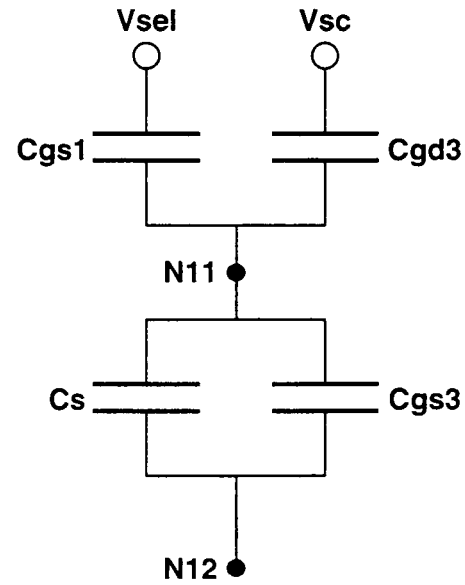

FIGS. 7A, 7B and 7C are conceptual views illustrating an influence of a parasitic capacitance formed in the display element drive circuit.

First, in the display element drive circuit (see FIG. 3), when a field effect transistor is applied as each of the first to third thin film transistors Tr11 to Tr13 constituting each switching element, as well known, a gate electrode (G) and a source electrode (S) of each thin film transistor are formed to face each other through a gate insulating film, and the gate electrode (G) and a drain electrode (D) are also formed to face each other through the gate insulating film. Therefore, as shown in FIG. 6A, parasitic capacitances Cgs and Cgd are generated between the gate and the source and between the gate and the drain of the thin film transistor TFT.

Therefore, in a display element drive circuit DC applied in this embodiment, as shown in FIG. 6B, a parasitic capacitance Cgs1 is formed between a gate electrode connected with the scanning line SL and a source electrode connected with the contact point N11 and a parasitic capacitance Cgd1 is formed between the gate electrode and a drain electrode connected with the power supply line VL in the first thin film transistor Tr11. Further, in the second thin film transistor Tr12, a parasitic capacitance Cgs2 is formed between a gate electrode connected with the scanning line SL and a source electrode connected with the contact point N12, and a parasitic capacitance Cgd2 is formed between the gate electrode and a drain electrode connected with the data line DL.

Furthermore, in the third thin film transistor Tr13, a parasitic capacitance Cgs3 is formed between a gate electrode connected with the contact point N11 and a source electrode connected with the contact point N12 and a parasitic capacitance Cgd3 is formed between the gate electrode and a drain electrode connected with the power supply line VL.

Moreover, since the organic EL element OEL has a diode junction configuration, a parasitic capacitance Coel caused due to a junction capacitance is formed between an anode electrode and a cathode electrode thereof.

Additionally, wiring capacities (parasitic capacitances) Cd-s and Cd-v are, respectively formed between the data line DL and the scanning line SL and between the data line DL and the power supply line VL.

Further, a capacitor Cs as a retention volume is connected between the contact points N11 and N12.

An influence of such various kinds of capacitance components on the drive control operation (that is, the display drive operation of the display apparatus) of the display element drive circuit is generally as follows.

(1) An operation delay is generated in the write operation and insufficient writing occurs due to the parasitic capacitance Cgd2 formed between the gate electrode (the scanning line SL) and the drain electrode (the data line DL) of the thin film transistor Tr12.

That is, in the write operation, in a state where the thin film transistor Tr12 is turned on by application of the high-level scanning signal Vsel to the scanning line SL and the display pixel EM (the display element drive circuit DC) is set in the selection state, when the gradation signal current Ipix is supplied through the data line DL, an operation of charging the wiring capacitances Cd-s and Cd-v formed in the data line DL and the parasitic capacitance Cdg2 of the second transistor Tr12 is executed by the gradation signal current Ipix prior to supply of the gradation signal current Ipix to the display pixel EM (the display element drive circuit DC), and then the gradation signal current Ipix is supplied to the contact point N12 through the thin film transistor Tr12. Therefore, a certain level of a delay time (that is, a delay in the write operation) is generated until the gradation signal current Ipix is actually written in the display pixel EM (the display element drive circuit DC) after the gradation signal current Ipix is supplied to the data line DL from the data driver 130.

Therefore, when a capacitance value of each of the wiring capacitances Cd-s or Cd-v formed in the data line DL or the parasitic capacitance Cdg2 is increased with an increase in size of the display panel 110, and when the number of the display pixels is increased with realization of a higher definition of the display panel 110 and a selection period allocated to each display pixel EM is set short, the capacitance component (the wiring capacitances Cd-s and Cd-v and the parasitic capacitance Cgd2) is charged within a previously defined selection period (the write operation period). Further, writing cannot be performed in the display pixel with a current value of the original gradation signal current, and hence insufficient writing of the display data occurs. As a result, the light emitting operation cannot be performed in each display pixel with a luminance gradation specified by the gradation signal current (the display data), thereby leading to deterioration of a display image quality.

In particular, when an amorphous silicon semiconductor layer is as a channel of the thin film transistor constituting the display pixel EM (the display element drive circuit DC), a transistor size (a width of the gate electrode) must be increased since electron mobility of amorphous silicon is relatively low. In this case, a capacitance value of the parasitic capacitance Cgd2 of the thin film transistor Tr12 becomes higher than that of each of the wiring capacitances Cd-s and Cd-v of the data line DL, which is a main factor of the above-described insufficient writing.

(2) A current error of a driving current occurs in the light emitting operation and hence light emission characteristics are deteriorated due to a parasitic capacitance Cgs1 formed between the gate electrode (the scanning line SL) and the source electrode (the contact point N11) of the first thin film transistor Tr11 and a parasitic capacitance Cgd3 formed between the gate electrode (the contact point N11) and the drain electrode (the power supply line VL) of the third thin film transistor Tr13.

That is, even if the above-described write operation is sufficiently executed within a predetermined selection period, a gate voltage (a potential of the contact point N11) of the thin film transistor Tr13 fluctuates due to a switching operation when shifting from the write operation (the selection period) of the display pixel EM to the light emitting operation (the non-selection period), and there occurs a phenomenon (a current error) that a current value of the driving current with respect to the write current (the gradation signal current) fluctuates.

Specifically, verifying a change in a voltage applied to the capacitor Cs as a retention volume when shifting from the write operation to the light emitting operation (when switching levels of the scanning signal Vsel and the power supply voltage Vsc), an influence on the capacitor Cs by switching (the high level→the low level) of the level of the scanning signal Vsel applied to the scanning line SL can be explained by using such an equivalent circuit as shown in FIG. 7A, and an influence on the capacitor Cs by switching (the low level→the high level) of the power supply voltage Vsc applied to the power supply line VL can be explained by using such an equivalent circuit as shown in FIG. 7B.

That is, when the scanning signal Vsel is switched (falls) from the high level to the low level, as shown in FIG. 7A, the parasitic capacitance Cgs1 between the gate and the source of the thin film transistor Tr11, the capacitor Cs and a junction capacitance Coel of the organic EL element OEL are connected in series, and an equivalent circuit in which the scanning signal Vsel and the ground potential Vgnd are respectively applied to both ends of these capacitances is formed. Therefore, the electric charges (the voltage component) stored in the capacitor Cs are redistributed by capacitance coupling of these capacitance components in dependence on a capacitance value of the parasitic capacitance Cgs1, thereby lowering the voltage applied to the contact point N11.

When the power supply voltage Vsc is switched (rises) from the lower level to the high level, as shown in FIG. 7B, the parasitic capacitance Cgd3 between the gate and the drain of the thin film transistor Tr13, the capacitor Cs and the junction capacitance Coel of the organic EL element OEL are connected in series, and an equivalent circuit in which the power supply voltage Vsc and the ground potential Vgnd are respectively applied to both ends of these capacitances is formed. Therefore, the voltage applied to the contact point N11 is increased by capacitance coupling of these capacitance components in dependence on a voltage level of the power supply voltage Vsc, a capacitance value of the parasitic capacitance Cgd3 and a voltage component held in the capacitor Cs.

Therefore, the gate voltage applied to the thin film transistor Tr13 fluctuates in dependence on capacitance values of the parasitic capacitance Cgs1 between the gate and the source of the first transistor Tr11 and the parasitic capacitance Cgd3 between the gate and the drain of the third transistor Tr13, a difference (a current error) is generated between the driving current supplied to the organic EL element OEL and the write current (the gradation signal current), and the light emitting operation cannot be performed with an appropriate luminance gradation, thereby deteriorating a display image quality (lowering contrast).

(3) The voltage at both ends of the capacitor Cs is lowered in the light emitting operation by the parasitic capacitance Cgs1 formed between the gate electrode (the scanning line SL) and the source electrode (the contact point N11) of the first transistor Tr11 and the parasitic capacitance Cgd3 formed between the gate electrode (the contact point N11) and the drain electrode (the power supply line VL) of the third transistor Tr13, and the driving current is reduced, thus deteriorating the light emission characteristics.

That is, in the light emitting operation (the non-selection state) after end of the write operation, when the scanning signal Vsel is set to the low level, the first and second transistors Tr11 and Tr12 are turned off and, on the other hand, the third transistor Tr13 is turned on by the voltage component held in the capacitor Cs. As a result, the driving current flows to the organic EL element OEL from the power supply line VL through the thin film transistor Tr13 and the contact point N12.

Consequently, the potential of the contact point N12 is increased. However, in this case, an influence on the capacitor Cs by the parasitic capacitance Cgs1 between the gate and the source of the first transistor Tr11 and the parasitic capacitance Cgd3 between the gate and the drain of the third transistor Tr13 can be explained by using such an equivalent circuit as shown in FIG. 7C.

As shown in FIG. 7C, in the equivalent circuit in which the parasitic capacitance Cgs1 between the gate and the source of the first transistor Tr11 is connected between the scanning line SL (the scanning signal Vsel) and the contact point N11, the parasitic capacitance Cdg3 between the gate and the drain of the third transistor Tr13 is connected between the power supply line VL (the power supply voltage Vsc) and the contact point N11 and the capacitor Cs and the parasitic capacitance Cgs3 between the gate and the third transistor Tr13 are connected between the contact point N11 and the contact point N12 in parallel, when the parasitic capacitances Cgs1 and Cgs3 are not connected, an increase in the potential of the contact point N12 provokes an increase in the potential of the contact point N11, and the voltage at both ends of the capacitor Cs is held constant. However, when the parasitic capacitances Cgs1 and Cgs3 are connected with each other, even if the potential of the contact point N12 is increased, and the potential of the contact point N11 does not follow up this change, thereby lowering the voltage at both ends of the capacitor Cs.

Therefore, a current value of the driving current flowing in the organic EL element OEL through the thin film transistor Tr13 does not correspond to the write current (the gradation signal current), and the light emitting operation cannot be performed with an appropriate luminance gradation, thereby deteriorating a display image quality.

The above-described problem becomes prominent particularly when an amorphous silicon semiconductor layer whose electron mobility is relatively low is applied as the thin film transistor constituting the display element drive circuit. That is, in the thin film transistor having polycrystal silicon (polysilicon) applied to the semiconductor layer, since its electron mobility is approximately 100 times that of amorphous silicon, a transistor size (a gate width in particular) can be set relatively small, and values of the above-described parasitic capacitances can be reduced in accordance with this transistor size.

On the contrary, in case of applying an amorphous silicon semiconductor whose manufacturing process is simpler than that of a polysilicon semiconductor and which can obtain stable element characteristics, since its electron mobility is low as described above, a transistor size (a gate width in particular) must be set relatively large in order to realize element characteristics (current density or the like) equivalent to those in a case where a polysilicon semiconductor layer is applied. Therefore, capacitance values of the above-described parasitic capacitances become higher than those in the example using the polysilicon semiconductor layer, thereby adversely affecting the drive control operation of the display element drive circuit DC of the display pixel EM as mentioned above.

Thus, in this embodiment, as described below, in the display pixel (the display element drive circuit) including as a switching element the thin film transistor to which an amorphous silicon semiconductor layer whose electron mobility is relatively low is applied, respective gate widths are set to be different on the source side and on the drain side of the thin film transistor in order to reduce capacitance values of the parasitic capacitances formed in each thin film transistor while holding a high current supply capability, whereby an influence of the parasitic capacitances on the drive control operation of the display pixel (the display element drive circuit) is suppressed.

<First Embodiment of Display Element Drive Circuit>

Figure 8:
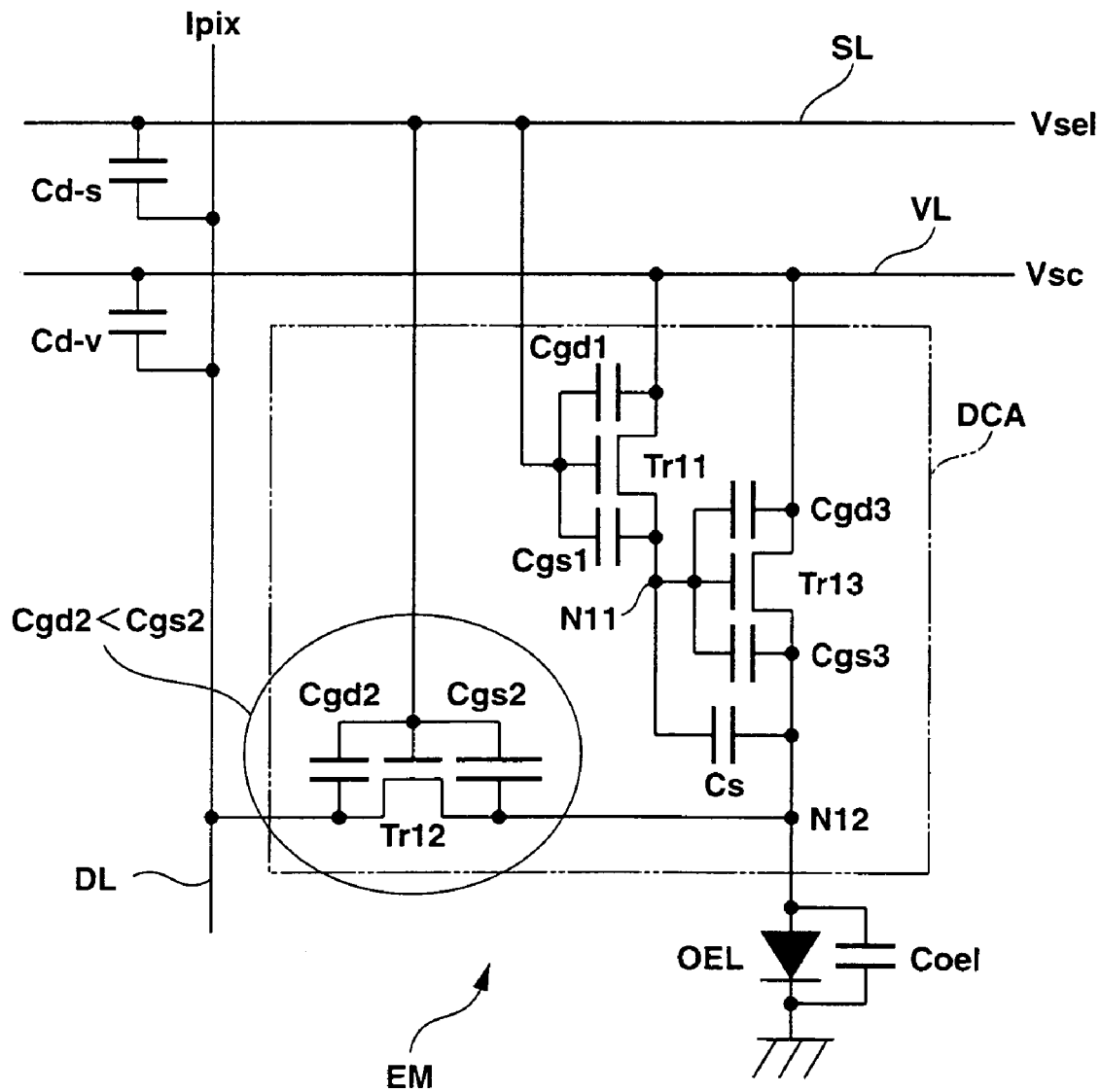
FIG. 8 is a circuit configuration view showing a first embodiment of the display element drive circuit according to the present invention.
Figure 9A:
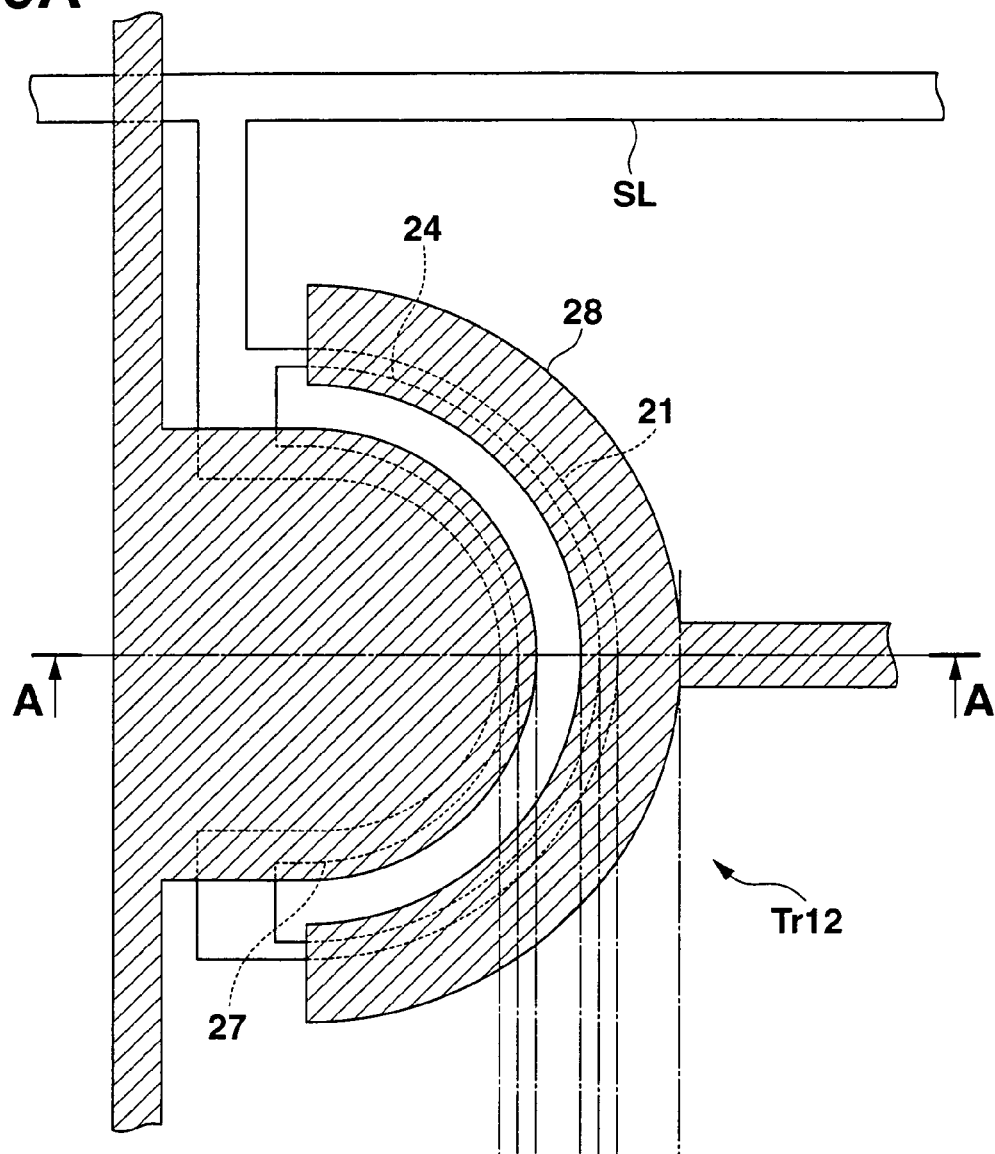
FIGS. 9A and 9B are schematic structural views showing a structural example of an element configuration of a thin film transistor which is applied to the display element drive circuit according to the first embodiment.
Figure 9B:
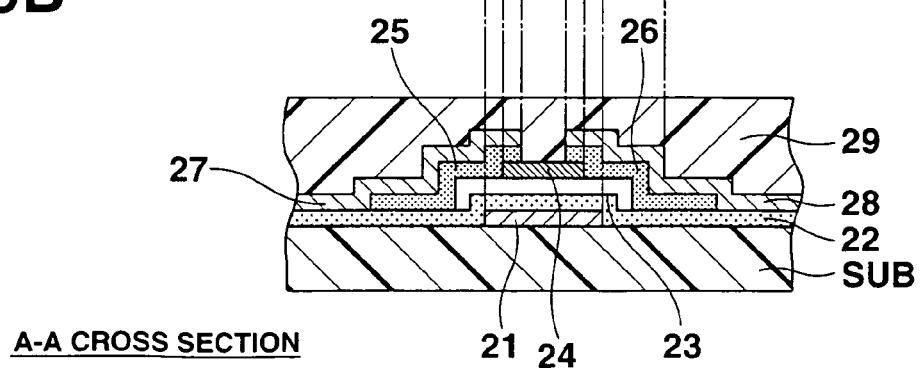

FIG. 8 is a circuit configuration view showing a first embodiment of the display element drive circuit according to the present invention. FIGS. 9A and 9B are schematic structural views showing a structural example of an element configuration of a thin film transistor applied to the display element drive circuit according to this embodiment.

In FIG. 8, like reference numerals denote circuit configurations equivalent to those in the display element drive circuit, thereby simplifying the explanation. Moreover, in FIGS. 9A and 9B, hatching is provided to a drain electrode, a data line and a source electrode in order to clarify the drawings for the convenience's sake.

As shown in FIG. 8, in a circuit configuration equivalent to the display element drive circuit DC depicted in FIG. 3, a display element drive circuit DCA according to this embodiment has a structure in which, of parasitic capacitances formed in a write control thin film transistor Tr12 in which one end side (a drain electrode side) of a current path is connected with a data line DL and a control terminal (a gate electrode) is connected with a scanning line SL, a parasitic capacitance Cgs2 between a gate and a source is set larger than a parasitic capacitance Cgd2 between the gate and a drain (Cgd2<Cgs2).

Here, a concrete element configuration of the second thin film transistor Tr12 has an electrode configuration in which a planar shape of each of a drain electrode and a source electrode has an asymmetrical shape and, for example, as shown in FIG. 9A, each of opposite sides of these electrodes has a circular shape and is formed to extend in a semicircular shape and a semi-arc shape.

Specifically, as shown in FIGS. 9A and 9B, the drain electrode 27 of the second transistor Tr12 has a shape protruding from the data line DL in a substantially semicircular shape with a circular arc outer peripheral portion and, on the other hand, the source electrode 28 is formed into a strip-like shape having a circular arc outer peripheral portion in such a manner that the source electrode 28 faces the outer peripheral portion of the drain electrode 27 at an equal interval therebetween. That is, shapes of the opposite outer peripheral portions of the drain electrode 27 and the source electrode 28 are formed to correspond to circular arcs as a part of concentric circles having different radius.

Additionally, each of a semiconductor layer 23, a gate electrode 21 and a block insulating film 24 of the thin film transistor Tr12 is also formed into a circular arc strip-like shape in accordance with the shape of each of the opposite outer peripheral portions of the source electrode 27 and the drain electrode 28.

A concrete cross-sectional structure of the thin film transistor Tr12 is, as shown in FIGS. 9A and 9B, configured to have the semiconductor layer (a channel region) 23 formed of amorphous silicon or the like, the block insulating film (an etching stopper film) 24 laminated on the semiconductor layer 23 (an upper part in the drawing), the source electrode 28 (a source terminal S) and the drain electrode 27 (a drain terminal D) formed to partially overlap on both end portions of the semiconductor layer 23 and the block insulating film 24 through impurity doped layers (ohmic contact layers) 25 and 26 formed of $n^+$-silicon, and the gate electrode 21 formed below the semiconductor layer 23 (a lower part in the drawing) through the gate insulating film 22. Reference numeral 29 denotes a protection film formed of an insulating material.

The thin film transistor having such a configuration is, as shown in FIG. 9B, formed on an insulative substrate SUB such as a glass substrate. In the element configuration shown in FIG. 9B, the block insulating film 24 superimposed and formed on the semiconductor layer 23 has a function as an etching stopper in an etching process when patterning the source electrode 28 and the drain electrode 27 provided on the semiconductor layer 23 as well as a function of avoiding a damage to the semiconductor layer 23 by this etching.

A relationship between a gate width and a channel current in the thin film transistor having such an element configuration (an electrode shape) will now be verified in detail.

Figure 10A:
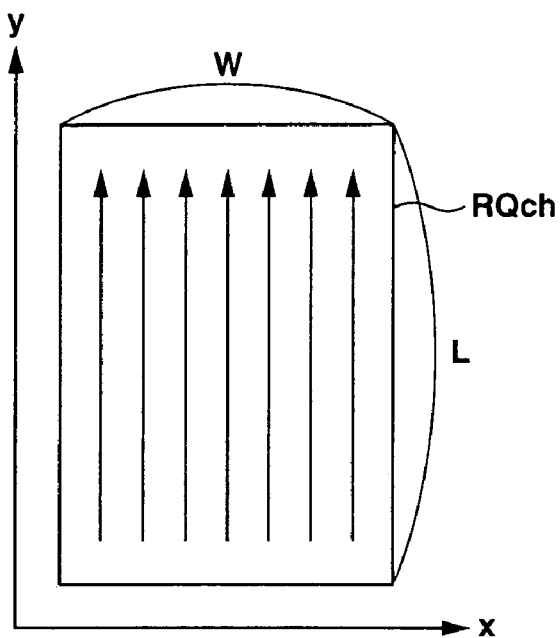
FIGS. 10A and 10B are views illustrating a relationship between a shape of a channel region formed in a semiconductor layer of the thin film transistor and a current flowing through the channel region.
Figure 10B:
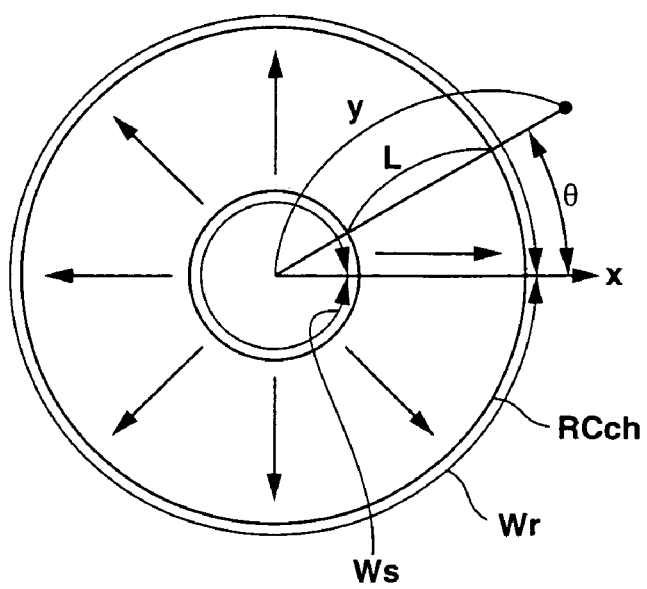

FIGS. 10A and 10B are views illustrating a relationship between a shape of a channel region formed in the semiconductor layer of the thin film transistor and a current (a channel current) flowing through the channel region.

Figures 11A, 11B:
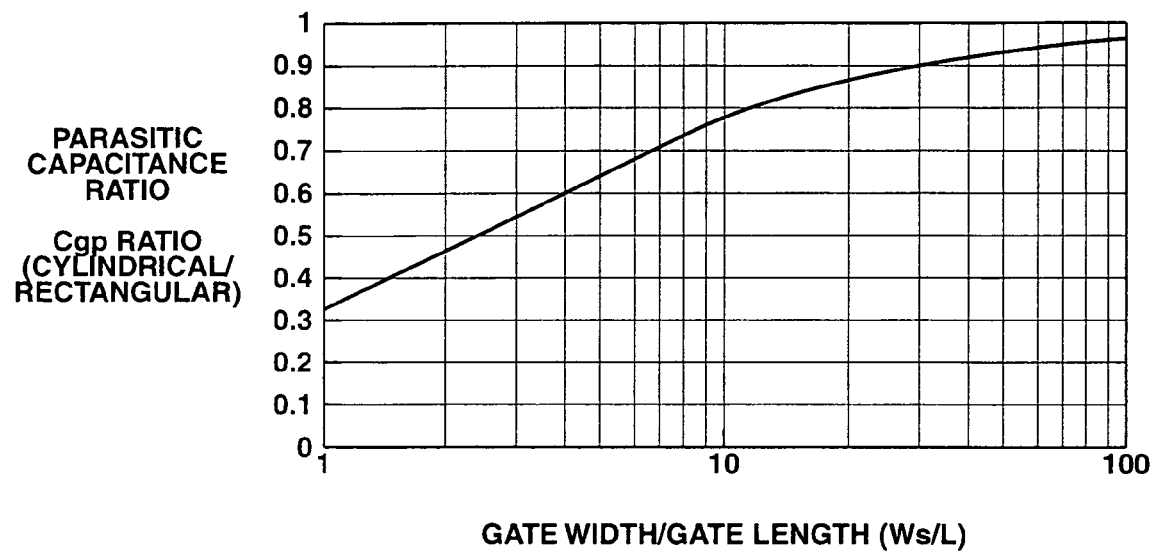
FIGS. 11A and 11B are characteristic views showing a relationship between a gate shape of the thin film transistor and a parasitic capacitance formed in the thin film transistor.

FIGS. 11A and 11B are characteristic views (a simulation result) showing a relationship between a gate shape (a gate width and a gate length) of the thin film transistor and a parasitic capacitance formed in the thin film transistor.

First, in an element configuration having a drain electrode and a source electrode each of which has a rectangular (square) outer peripheral portion applied to a general thin film transistor, and having a semiconductor layer and a gate electrode each of which is formed into a rectangular (oblong) shape in accordance with the shape of each of the drain electrode and the source electrode, as shown in FIG. 10A, considering a channel region RQch corresponding to the rectangular gate electrode, both widths (gate widths) W of the gate electrode facing the drain electrode and the source electrode arranged above and below the channel region RQch (that is, the gate electrode) in FIG. 10A are equal to each other.

Here, a channel current per unit gate width can be represented by a differential equation shown in the following Expression (1) by using a gradual channel approximation method irrespective of a shape of the channel region or the gate width.

$$Iy=-g(Vg-V)\cdot dV/dy \tag{1}$$

In Expression (1), it is assumed that a flowing direction of the channel current is a y axis direction (an upper side in the drawing), g is a channel conductance determined based on a gate voltage, and V is a channel potential and represented as Vs at a source end and Vd at a drain end. Further, a function g(Vx) is presupposed like the following Expression (2).

$$g(Vx)=\mu\cdot Cox\cdot (Vx-Vth)dV/dy \tag{2}$$

In Expression (2), μ is electron mobility, Cox is a gate capacitance per unit area, and Vth is a threshold voltage of the thin film transistor.

Based on this Expression (2), Expression (1) can be represented like the following Expression (3).

$$Iy=-\mu\cdot Cox\cdot (Vg-V-Vth)\cdot dV/dy \tag{3}$$

Here, as shown in FIG. 10A, considering a current flowing through the rectangular channel region RQch by using a rectangular coordinate system including an x direction and a y direction, when a channel current flows in the y direction, since current density in the x direction (a direction orthogonal to the flowing direction of the current) is uniform, integrating a width W with which the channel current flows can derive the following expression (4).

$$I=-\mu\cdot Cox\cdot W\cdot (Vg-Vth-V)dV/dy$$

$$Idy=-\mu\cdot Cox\cdot W\cdot (Vg-Vth-V)dV \tag{4}$$

Since Expression (4) has been subjected to variable separation, integrating a left-hand side and a right-hand side can derive the following Expression (5).

$$I=-(W/L)\cdot \mu Cox\cdot (Vd-Vs)\cdot \{Vg-Vs-Vth-0.5\cdot (Vd-Vs)\} \tag{5}$$

In Expression (5), L is a length of the gate electrode (a gate length), and W is a gate width (a width with which the channel current flows).

Next, in an element configuration having a drain electrode and a source electrode each of which has a concentric outer peripheral portion applied to the thin film transistor Tr12 according to this embodiment and having a semiconductor layer and a gate electrode each of which is formed into a cylindrical or ring (donut-like) shape in accordance with the shape of each of the drain electrode and the source electrode, as shown in FIG. 10B, considering a channel region RCch corresponding to the cylindrical (donut-like) gate electrode, each of widths Ws and Wr of the gate electrode facing the drain electrode and the source electrode formed on an inner peripheral side and an outer peripheral side of the channel region RCch (that is, the gate electrode) become uneven.

Here, like the above-described example, in Expression (3) derived based on the channel current per unit gate width using the gradual channel approximation method, as shown in FIG. 10B, considering a current flowing through the cylindrical channel region RCch by using a cylindrical coordinate system including an angle θ and the y direction, when the channel current flows in the y direction (in a radial pattern), since current density in a direction of the angle θ (a direction orthogonal to the current) is uniform, integrating a width with which the channel current flows in Expression (3) can derive the following Expression (6)

$$I=-\mu\cdot Cox\cdot 2\pi y\cdot (Vg-Vth-V)dV/dy$$

$$Idy/y=-\mu\cdot Cox\cdot 2\pi\cdot (Vg-Vth-V)dV \tag{6}$$

Since variable separation has been carried out in Expression (6), integrating a left-hand side and a right-hand side can derive the following Expression (7).

$$I=-2\pi/\ln(1+2\pi L/Ws)\cdot \mu\cdot Cox\cdot (Vd-Vs)\cdot \{Vg-Vs-Vth-0.5\cdot (Vd-Vs)\} \tag{7}$$

In Expression (7), Ws is a gate width on an inner peripheral side in the cylindrical gate electrode.

Based on this, it was revealed that, when the gate width W in the element configuration having the rectangular gate electrode (the channel region RQch) is set equal to the gate width Ws on the inner peripheral side in the element configuration having the cylindrical gate electrode (the channel region RCch), that is, when capacitance values of parasitic capacitances defined based on the gate widths W and Ws are set to be equal to each other, a current value of the channel current (Expression (7)) in the element configuration having the cylindrical gate electrode (the channel region RCch) depicted in FIG. 10B becomes $2\pi L/\{Ws\cdot \ln(1+2\pi L/Ws)\}$ times a current value of the channel current (Expression 5) in the element configuration having the rectangular gate electrode (the channel region RQch) shown in FIG. 10A.

In other words, this means that, in case of allowing the same current to flow in the channel regions, the gate width in the element configuration having the cylindrical gate electrode (that is, a parasitic capacitance defined by this gate width) can be reduced to be $Ws\cdot \ln(1+2\pi L/Ws)/2\pi L$ times the gate width in the element configuration having the rectangular gate electrode.

Here, a ratio of the gate width of the cylindrical gate electrode (the channel region RCch) with respect to the rectangular gate electrode (the channel region RQch) is converted to a ratio of the parasitic capacitance (a Cgp ratio), and a verification is performed about a relationship of the ratio of the parasitic capacitance with respect to a ratio of the gate width and the gate length (Ws/L) in the element configuration having the cylindrical gate electrode (the channel region RCch) when the same current flows through the channel region. Then, such a result as shown in FIG. 11 can be obtained.

According to this result, it can be understood that, as shown in FIGS. 11A and 11B, in the element configuration having the cylindrical gate electrode (the channel region RCch), the ratio of the parasitic capacitance (the Cgp ratio) becomes approximately 1 or below irrespective of the ratio of the gate width and the gate length (Ws/L), and the parasitic capacitance can be reduced as compared with the element configuration having the rectangular gate electrode (the channel region RQch).

Therefore, by applying the thin film transistor having such an element configuration as shown in FIGS. 9A and 9B to the second transistor (a selection control circuit) Tr12 of the display element drive circuit DCA having a circuit configuration depicted in FIG. 8, the gate width on the source side in the thin film transistor Tr12 can be set larger than that on the drain side. Furthermore, as described above, a capacitance value of the parasitic capacitance Cgd2 formed on the drain side can be further reduced as compared with that in the example where the rectangular gate electrode (the channel region) is applied to the thin film transistor Tr12, and the same channel current can be allowed to flow.

As a result, of the wiring capacitances which are parasitic on the gate line DL, the capacitance component caused due to the parasitic capacitance Cgd2 on the drain side of the thin film transistor Tr12 can be reduced, and hence a write ratio can be improved while suppressing an operation delay which occurs in the operation of writing the gradation signal current in the display pixel (the display element drive circuit).

(Another Structural Example of Thin Film Transistor)

Figure 12A:
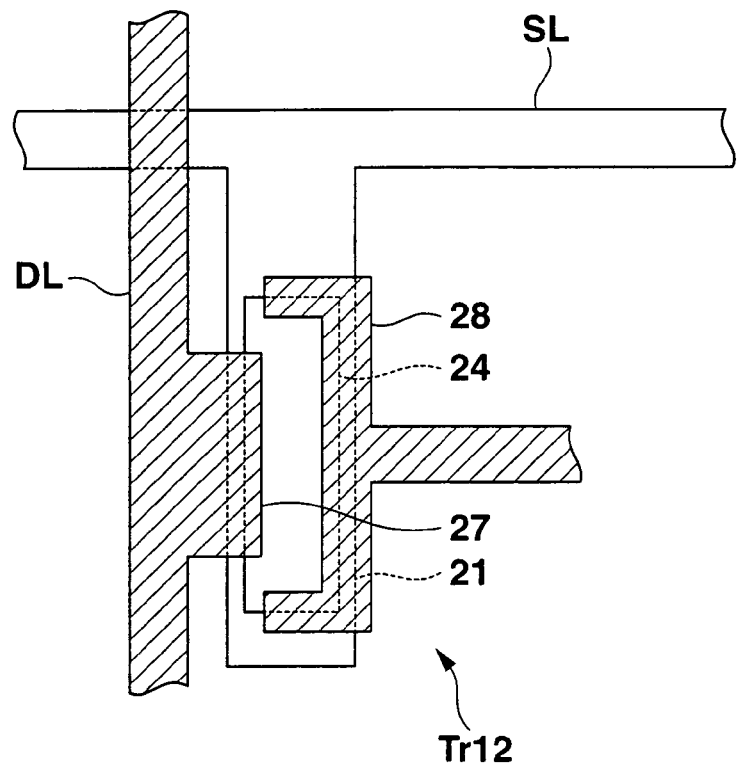
FIGS. 12A and 12B are schematic structural views showing another structural example of an element configuration of a thin film transistor which is applied to the display element drive circuit according to the first embodiment.
Figure 12B:
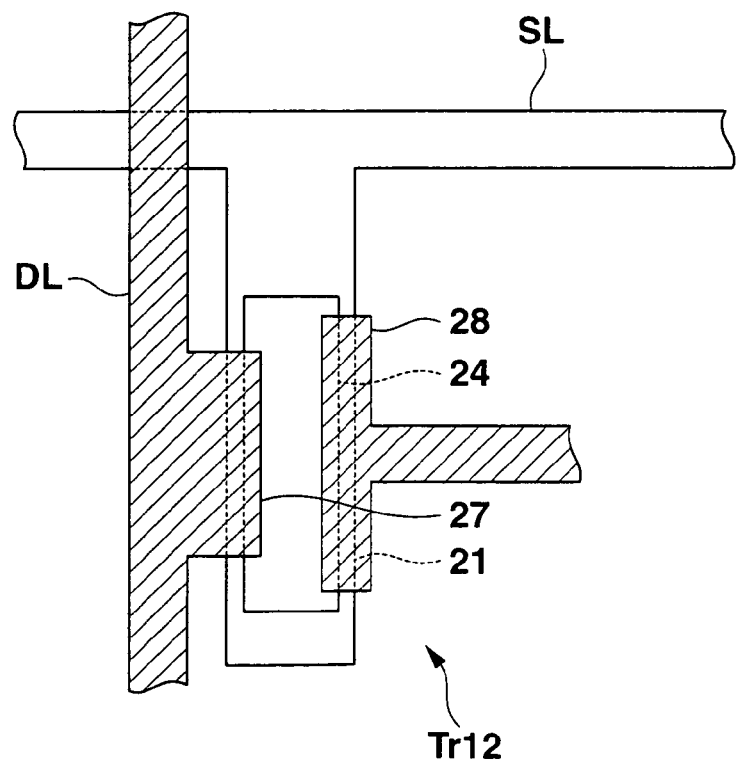

FIGS. 12A and 12B are schematic structural views showing another structural example of the element configuration of the thin film transistor applied to the display element drive circuit according to this embodiment.

Here, like reference numerals denote structures equal to those in the above-described element configuration of the thin film transistor (FIG. 9A), thereby simplifying the explanation. Furthermore, in order to clarify the drawings, hatching is provided to a drain electrode, a data line and a source electrode for the convenience's sake.

In the first structural example of the thin film transistor applied to the foregoing embodiment, the description has been given as to the case where the semiconductor layer forming the channel region is formed into a circular arc strip-like shape, and the source electrode and the drain electrode are formed in such a manner that they partially extend on both ends of the semiconductor layer and each of their opposite outer peripheral portions has a circular arc shape. However, as described above, in the display element drive circuit according to the present invention, the influence of the above-described parasitic capacitance on the operation characteristics (the operation delay in the write operation or insufficient writing in this embodiment) can be suppressed by setting the parasitic capacitances formed on the source side and the drain side of the thin film transistor having a specific function (a function as the selection control circuit in this embodiment) to be different from each other.

Thus, as the element configuration of the thin film transistor Tr12 which is applicable to the display element drive circuit according to this embodiment, it is possible to excellently apply an electrode configuration in which a planar shape of each of a drain electrode and a source electrode has an asymmetrical shape, a drain electrode 27 has a linear outer peripheral portion and is formed into a shape (a convex shape) protruding from the data line DL as shown in, e.g., FIG. 12A and, on the other hand, a source electrode 28 is formed into a shape (a concave shape) having a depressed outer peripheral portion to face the outer peripheral portion of the drain electrode 27, or an electrode configuration in which the drain electrode 27 has a linear outer peripheral portion and is formed into a shape (a convex shape) protruding from the data line DL and, on the other hand, the source electrode 28 has a linear outer peripheral portion and is formed into a rectangular shape to face the outer peripheral portion of the drain electrode 27 as shown in, e.g., FIG. 12B.

Further, each of the semiconductor layer 23 (see FIG. 9), the gate electrode 21 and the block insulating film 24 is also formed into a rectangular shape (a square shape) in accordance with the shapes of the opposite outer peripheral portions of the source electrode 27 and the drain electrode 28, as shown in FIGS. 12A and 12B.

As a result, since respectively formed parasitic capacitances can be set to be relatively different from each other with different gate widths on the source side and the drain side of the thin film transistor, the above-described influence of the parasitic capacitances on the operation characteristics (the operation delay in the write operation or insufficient writing in the foregoing embodiment) can be suppressed, and the thin film transistor having desired parasitic capacitances can be formed with a relatively simple shape and a relatively small area.

<Second Embodiment of Display Element Drive Circuit>

Figure 13:
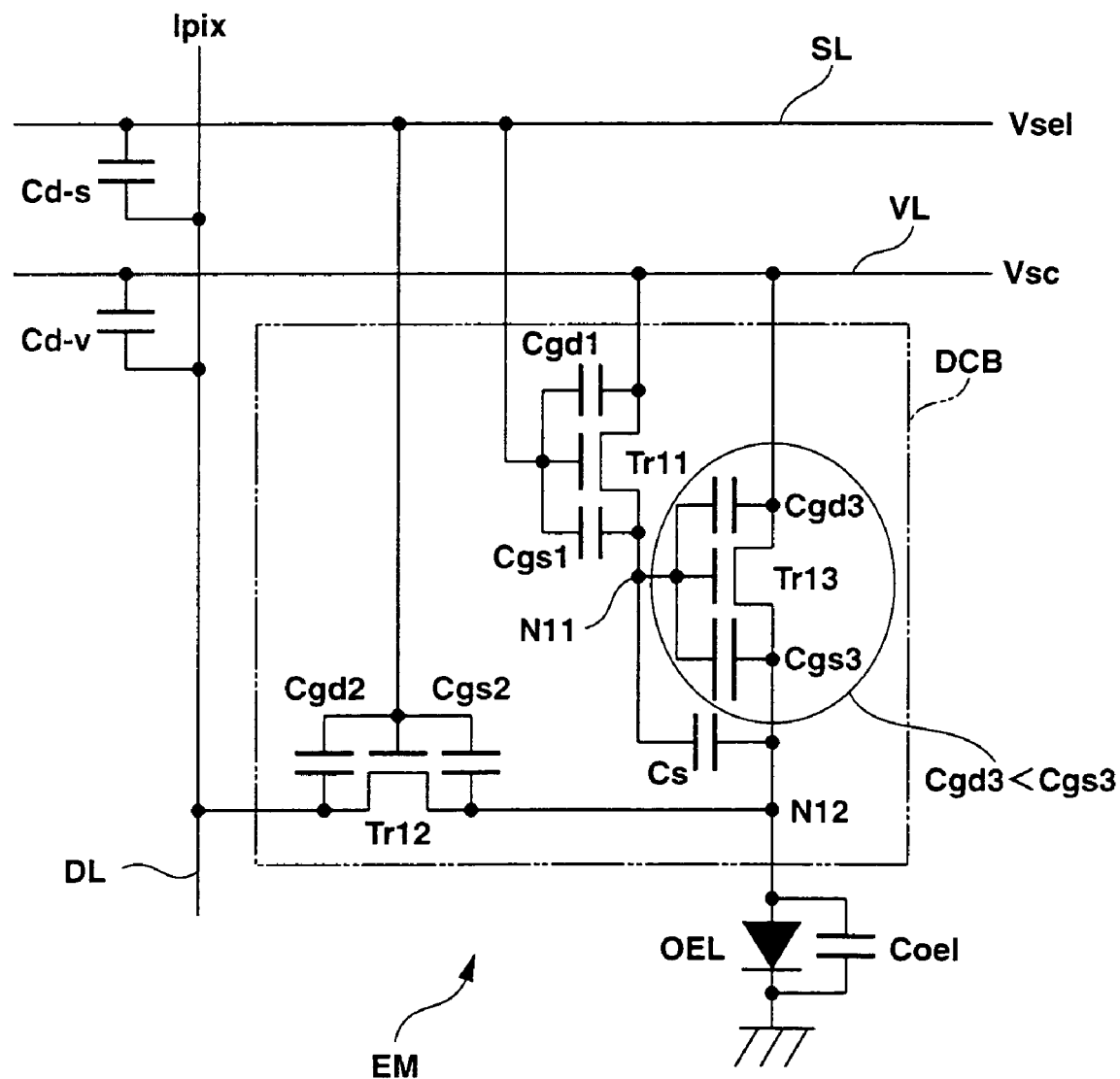
FIG. 13 is a circuit configuration view showing a second embodiment of a display element drive circuit according to the present invention.

FIG. 13 is a circuit configuration view showing a second embodiment of the display element drive circuit according to the present invention.

Figure 14:
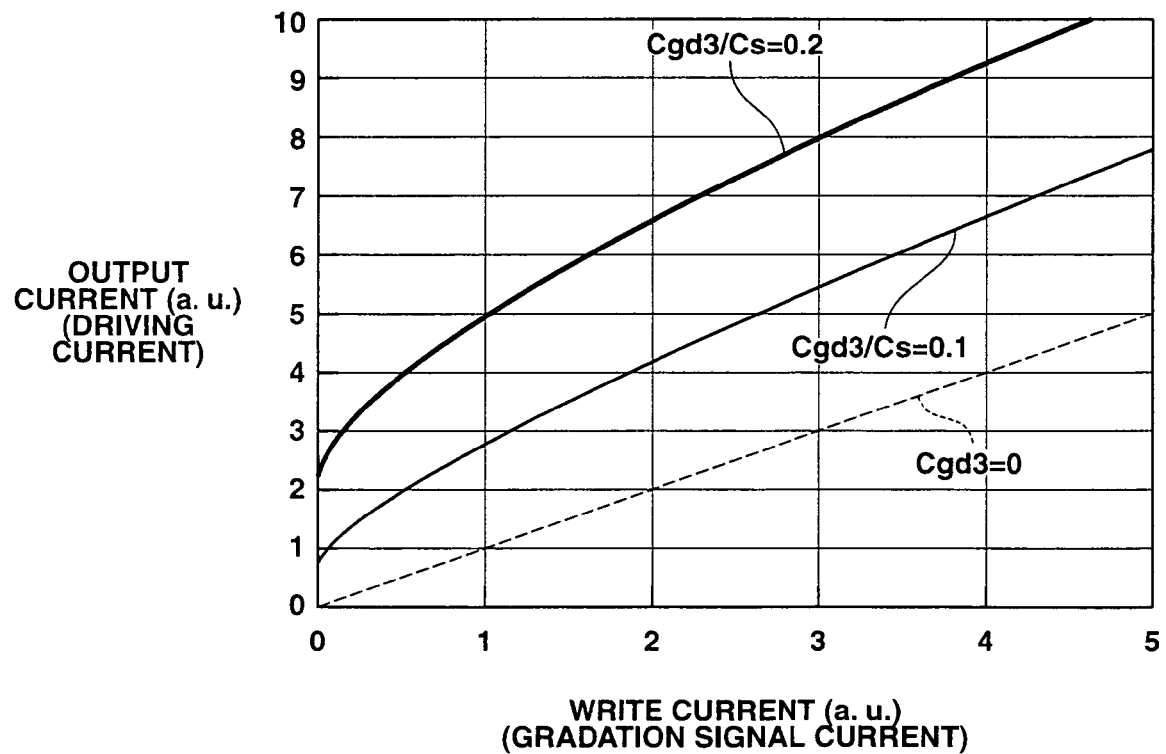
FIG. 14 is a characteristic view showing a relationship between a parasitic capacitance of a light emission control thin film transistor and an output current with respect to a write current.

FIG. 14 is a characteristic view showing a relationship between a parasitic capacitance of a light emission control thin film transistor and an output current (a driving current) with respect to a write current (a gradation signal current).

Here, like reference numerals denote circuit configurations equal to those in the first embodiment, thereby simplifying the explanation.

As shown in FIG. 13, in the same circuit configuration as the display element drive circuit DC depicted in FIG. 3, a display element drive circuit DCB according to this embodiment has a structure in which, of parasitic capacitances formed in a light emission control thin film transistor or third transistor Tr13 in which one end side of a current path (a source electrode side) is connected with an organic EL element (a display element) OEL and one end side (a contact point N12) of a capacitor Cs, the other end side (a drain electrode side) is connected with a power supply line VL and a control terminal (a gate electrode) is connected with the other end side (a contact point N11) of the capacitor Cs, a parasitic capacitance Cgs3 between a gate and a source is set to be larger than a parasitic capacitance Cgd3 between the gate and a drain (Cgd3<Cgs3).

Here, as a concrete element configuration of the third transistor Tr13, it is possible to excellently apply an element configuration according to each of the structural examples (FIGS. 9A, 9B and FIGS. 12A and 12B) of the second transistor Tr12 according to the first embodiment.

That is, each of a source electrode and a drain electrode formed to face each other with a semiconductor layer (a channel region) therebetween has an asymmetrical shape, and respective gate widths are set to be different from each other, whereby a parasitic capacitance between the gate and the source and a parasitic capacitance between the gate and the drain are relatively different from each other. In particular, in this embodiment, the parasitic capacitance Cgs3 between the gate and the source is larger than the parasitic capacitance Cgd3 between the gate and the drain.

Here, examining a relationship between the parasitic capacitance of the thin film transistor Tr13 in the display element drive circuit DC and an output current (a driving current) with respect to a write current (a gradation signal current), as shown in FIG. 14, it was confirmed that, when the parasitic capacitance Cgd3 between the gate and the drain of the third transistor Tr13 (a ratio of a capacitance value of the parasitic capacitance Cgd3 between the gate and the drain with respect to the capacitor Cs in FIG. 14; Cgd3/Cs) is increased, the thin film transistor Tr13 is turned on even if a write current written in the display element drive circuit DC is 0 (corresponding to black display), and a leakage current flows to the organic EL element OEL from the power supply line VL through the third transistor Tr13 as an output current.

Moreover, it was also confirmed that, when the parasitic capacitance Cgd3 between the gate and the drain of the third transistor Tr13 (a Cgd3/Cs ratio in FIG. 14) is increased as compared with linear characteristics (a characteristic line represented as Cgd3=0 in the drawing) of the output current with respect to the write current in an ideal circuit configuration where the parasitic capacitance Cgd3 between the gate and the drain of the transistor Tr13 does not exist, a current value of the output current (a driving current) with respect to the write current (a gradation signal current) is increased, and non-linearity is demonstrated.

Such a phenomenon that a current value of the output current with respect to the write current is increased is caused due to formation of capacitance coupling between the parasitic capacitance Cgd3 between the gate and the drain of the third transistor Tr13 and the capacitor Cs when the display element drive circuit shifts to the light emitting operation state from the write operation state as shown in FIG. 7B. However, in order to suppress such a phenomenon, relatively reducing the parasitic capacitance Cgd3 between the gate and the drain of the transistor Tr13, i.e., increasing a capacitance value of the capacitor Cs in the Cgd3/Cs ratio in the simulation shown in FIG. 14 can be considered, for example. However, in this case, a time required to hold (charge) a predetermined voltage component in the capacitor Cs becomes large in the write operation, and insufficient writing occurs.

Thus, in this embodiment, the element configuration according to each of the foregoing structural examples (FIGS. 9A and 9B and FIGS. 12A and 12B) is applied to the thin film transistor Tr13, thereby reducing the parasitic capacitance Cgd3 itself between the gate and the drain.

As a result, the ratio of the capacitance value of the parasitic capacitance Cgd3 between the gate and the drain with respect to the capacitor Cs (Cgd3/Cs) can be reduced, and hence the relationship of the output current with respect to the write current in the display element drive circuit DCB (the thin film transistor Tr13) can be approximated to ideal current characteristics shown in FIG. 14 (current characteristics that the output current with respect to the write current demonstrates linear characteristics and the output current becomes zero when the write current is zero).

Therefore, for example, when the display element drive circuit shifts from the write operation state to the light emitting operation state, the organic EL element can perform a light emitting operation with an appropriate luminance gradation corresponding to display data (the gradation signal current) even if, e.g., a power supply voltage Vsc applied to the power supply line VL rises, and a reduction in contrast can be suppressed, thereby improving a display image quality.

When the thin film transistor having the element configuration according to each of the above-described structural examples is applied, the parasitic capacitance Cgs between the gate and the source can be set to be different from the parasitic capacitance Cgd between the gate and the drain by setting the gate widths on the drain side and the source side to be relatively different from each other in order to obtain a predetermined current value. Therefore, as described above in conjunction with this embodiment, when the parasitic capacitance Cgd3 between the gate and the drain is set small, the parasitic capacitance Cgs3 between the gate and the source is set large. However, consequently, it is possible to hold a voltage component corresponding to the write current in the parasitic capacitance Cgs3 alone without the capacitor Cs connected to the source electrode side, or mainly in the parasitic capacitance Cgs3 with a reduced capacitance value of the capacitor Cs.

<Third Embodiment of Display Element Drive Circuit>

Figure 15:
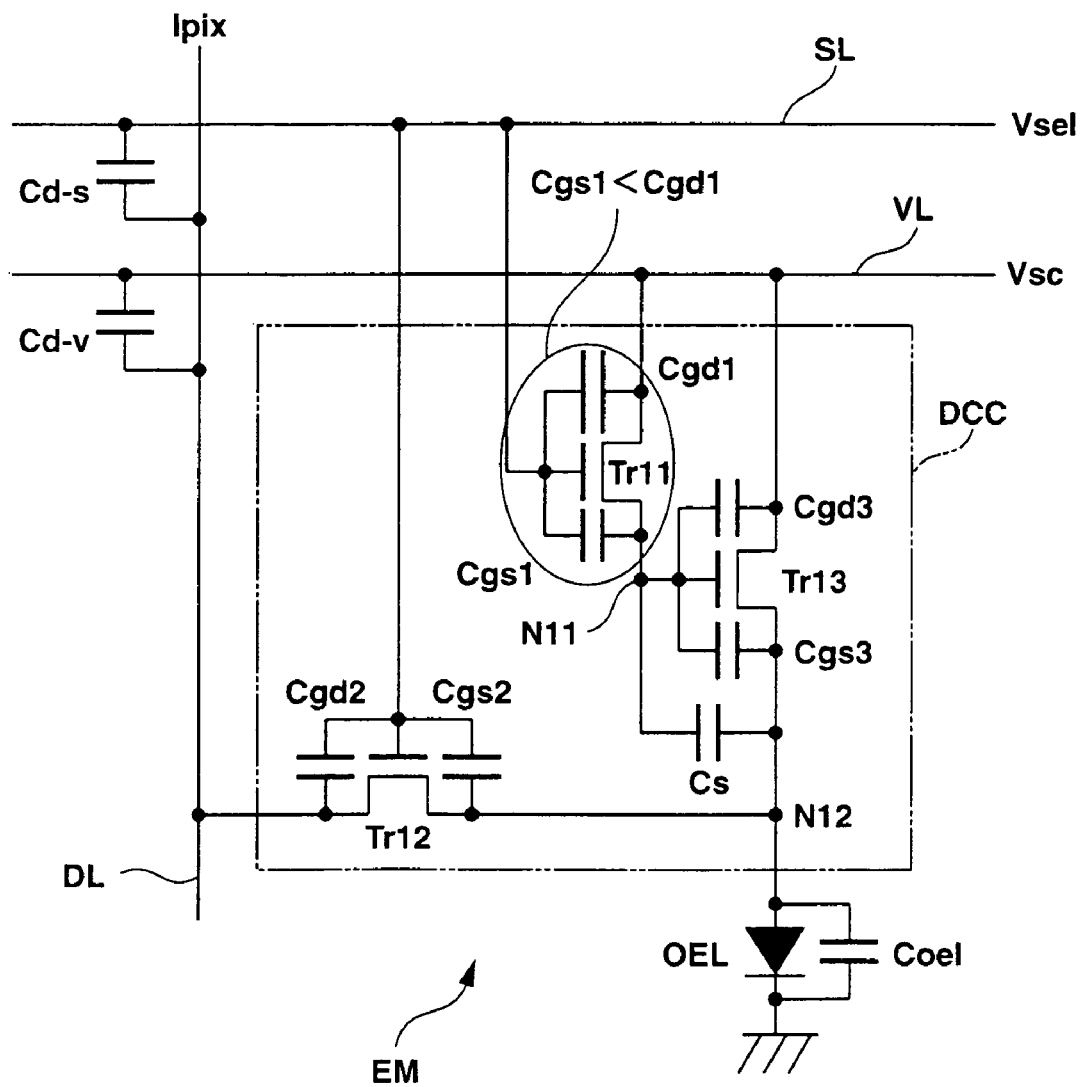
FIG. 15 is a circuit configuration view showing a third embodiment of a display element drive circuit according to the present invention.

FIG. 15 is a circuit configuration view showing a third embodiment of the display element drive circuit according to the present invention.

Here, like reference numerals denote the same circuit configurations as those in the foregoing embodiments, thereby simplifying the explanation.

As shown in FIG. 15, in the same circuit configuration as the display element drive circuit DC depicted in FIG. 3, a display element drive circuit DCC according to this embodiment has a structure in which, of parasitic capacitances formed in a write control thin film transistor or first transistor Tr11 in which one end side of a current path (a source electrode side) is connected with a gate terminal (a contact point N11) of a third thin film transistor Tr13, the other end side (a drain electrode side) is connected with a power supply line VL and a control terminal (a gate electrode) is connected with a scanning line SL, a parasitic capacitance Cgd1 between a gate and a drain is set to be larger than a parasitic capacitance Cgs1 between the gate and a source (Cgs1<Cgd1).

Here, as a concrete element configuration of the thin film transistor Tr11, it is possible to excellently apply the element configuration according to each of the structural examples (FIGS. 9A and 9B and FIGS. 12A and 12B) of the thin film transistor Tr12 according to the first embodiment.

That is, each of the source electrode and the drain electrode formed to face each other with a semiconductor layer (a channel region) therebetween has an asymmetrical shape, and respective gate widths are set to be different from each other, whereby the parasitic capacitance Cgd1 between the gate and the drain becomes larger than the parasitic capacitance Cgs1 between the gate and the source.

As described above in the examination of the parasitic capacitances in the display element drive circuit, when the display element drive circuit shifts from the write operation state to the light emitting operation state, as shown in FIG. 7A, electric charges stored in the capacitor Cs are redistributed by formation of capacitance coupling between the parasitic capacitance Cgs1 between the gate and the source of the first transistor Tr11 and the capacitor Cs, and there occurs a phenomenon that a voltage (a potential in the contact point N11) applied to the gate terminal of the light emission control thin film transistor Tr13 is lowered to reduce a driving current. However, previously increasing the write current can be considered in order to suppress such a phenomenon. In this case, however, since a load on the data driver 130 is increased, a large current supply capability must be designed, which leads to an increase in a size of a driver chip or in power consumption.

Thus, in this embodiment, the element configuration according to each of the foregoing structural examples (FIGS. 9A and 9B and FIGS. 12A and 12B) is applied to the thin film transistor Tr11 to reduce the parasitic capacitance Cgs1 itself between the gate and the source.

As a result, when the display element drive circuit shifts from the write operation state to the light emitting operation state, a quantity of the electric charges redistributed by capacitance coupling between the capacitor Cs and the parasitic capacitance Cgs1 between the gate and the source, a reduction in a potential at one end side (the contact point N11) of the capacitor Cs can be suppressed, and a decrease in the driving current flowing through the light emission control thin film transistor Tr13 can be constrained. Therefore, the organic EL element can operate to emit light with an appropriate luminance gradation corresponding to display data (a gradation signal current), thereby improving a display image quality while suppressing a reduction in contrast.

<Fourth Embodiment of Display Element Drive Circuit>

Figure 16:
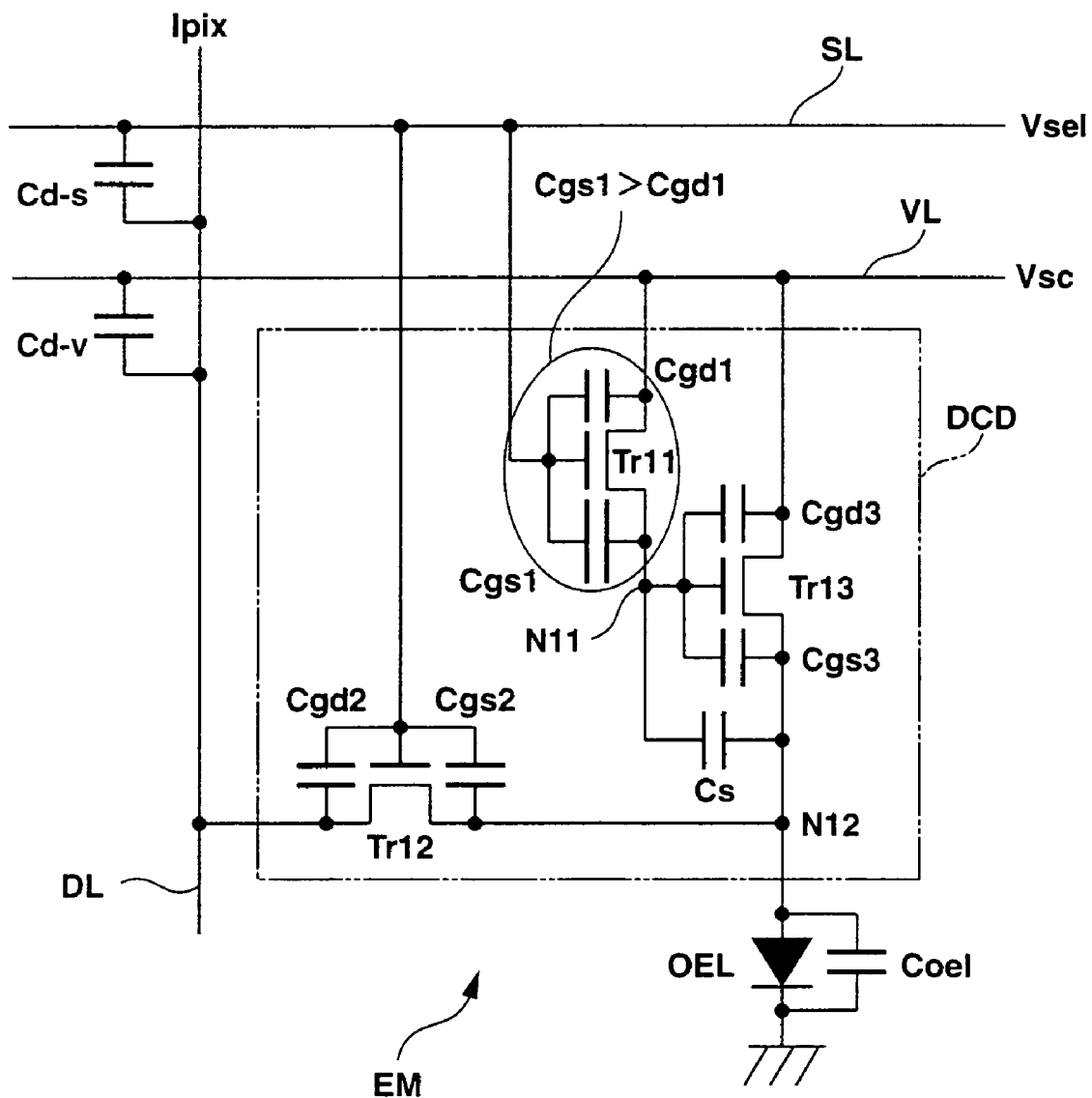
FIG. 16 is a circuit configuration view showing a fourth embodiment of a display element drive circuit according to the present invention.

FIG. 16 is a circuit configuration view showing a fourth embodiment of the display element drive circuit according to the present invention.

Here, like reference numerals denote the same circuit configurations as those in the foregoing embodiments, thereby simplifying the explanation.

As shown in FIG. 16, in the same circuit configuration as the display element drive circuit DCC depicted in FIG. 15, a display element drive circuit DCD according to this embodiment has a structure in which, of parasitic capacitances formed in a write control thin film transistor or first transistor Tr11, a parasitic capacitance Cgs1 between a gate and a source is set to be larger than a parasitic capacitance Cgd1 between the gate and a drain (Cgd1<Cgs1).

Here, as a concrete element configuration of the first transistor Tr11, it is possible to excellently apply an element configuration according to each of the structural examples (FIGS. 9A and 9B and FIGS. 12A and 12B) of the second transistor Tr12 according to the first embodiment.

That is, each of a source electrode and a drain electrode formed to face each other with a semiconductor layer (a channel region) therebetween has an asymmetrical shape, and respective gate widths are set to be different from each other. As a result, the parasitic capacitance Cgs1 between the gate and the source is larger than the parasitic capacitance Cgd1 between the gate and the drain.

Based on a concept of the parasitic capacitances in the display element drive circuit mentioned above, the parasitic capacitance Cgd1 between the gate and the drain of the thin film transistor Tr13 corresponds to an inter-wire capacitance between a scanning line SL and a power supply line VL. This inter-wiring capacitance (the parasitic capacitance Cgd1) can be a factor of the above-described insufficient writing since it increases a time constant when switching a voltage level applied to each line to obstruct a rapid shift to each operating state of the write operation and the light emitting operation, or a factor of increasing a load of the scanning driver 120 or the power supply driver to greaten power consumption.

Thus, in this embodiment, the element configuration according to each of the foregoing structural examples (FIGS. 9A and 9B and FIGS. 12A and 12B) is applied to the thin film transistor Tr11 to reduce the parasitic capacitance Cgd1 itself between the gate and the drain.

As a result, since the inter-wiring capacitance between the scanning line and the power supply line is reduced, a shift to each operation state in the drive control operation can be rapidly performed in the display element drive circuit, and the organic EL element can operate to emit light with an appropriate luminance gradation corresponding to display data while suppressing insufficient writing. Further, since the load on the scanning driver or the power supply driver which drives the scanning line or the power supply line can be decreased, thus constraining power consumption of the display apparatus.

<Fifth Embodiment of Display Element Drive Circuit>

Figure 17:
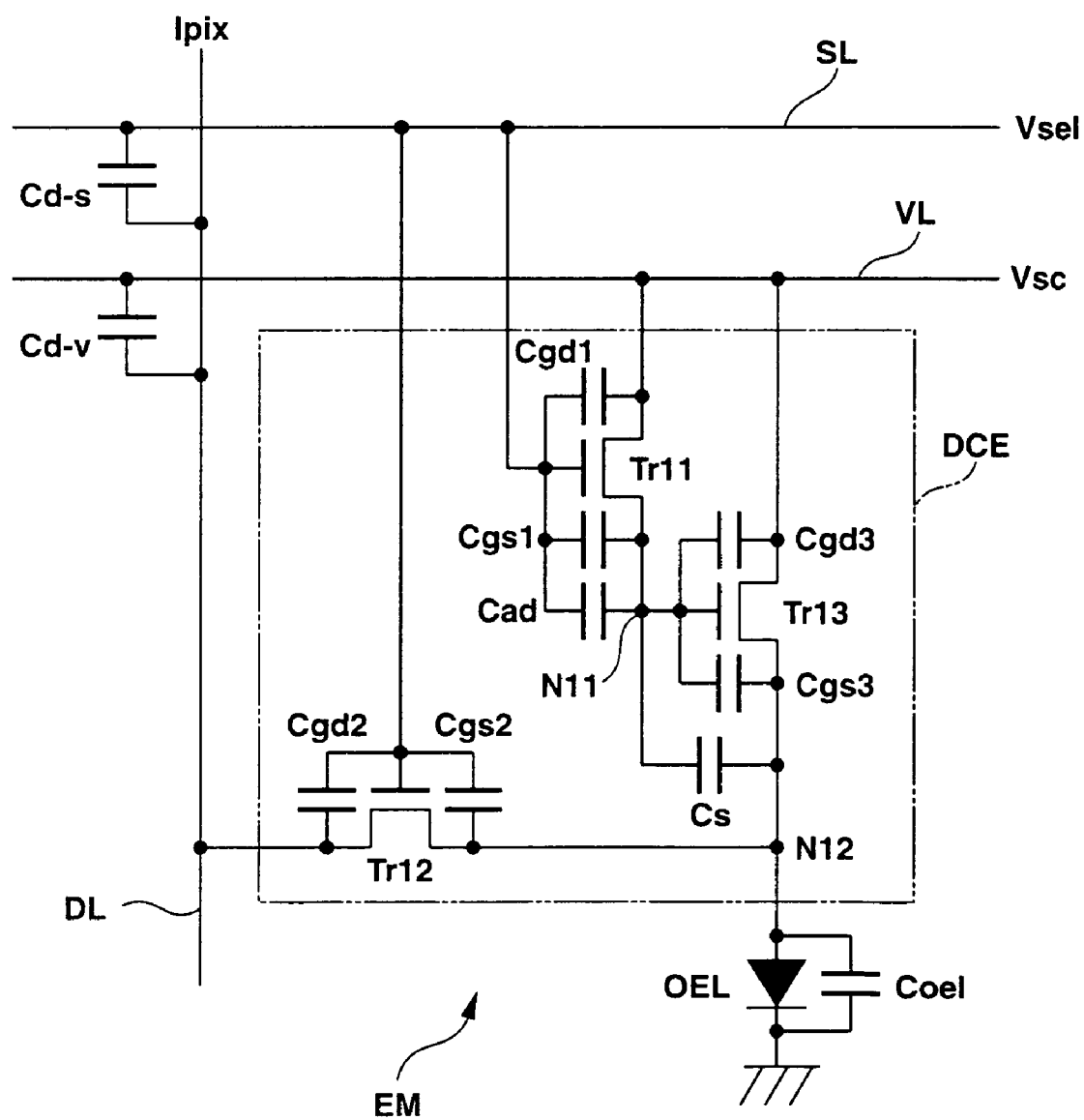
FIG. 17 is a circuit configuration view showing a fifth embodiment of a display element drive circuit according to the present invention.

FIG. 17 is a circuit configuration view showing a fifth embodiment of the display element drive circuit according to the present invention.

Figure 18:
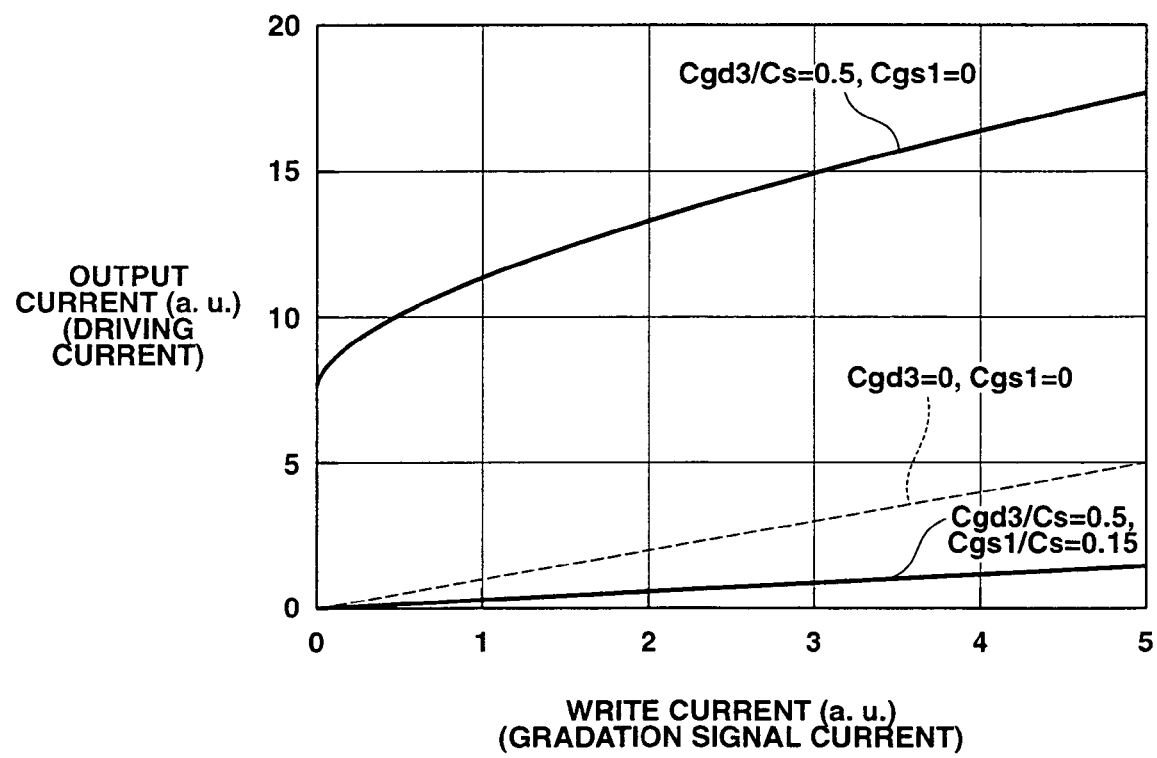
FIG. 18 is a characteristic view showing a relationship between a parasitic capacitance of a light emission control thin film transistor and an output current with respect to a write current.
Figure 19:
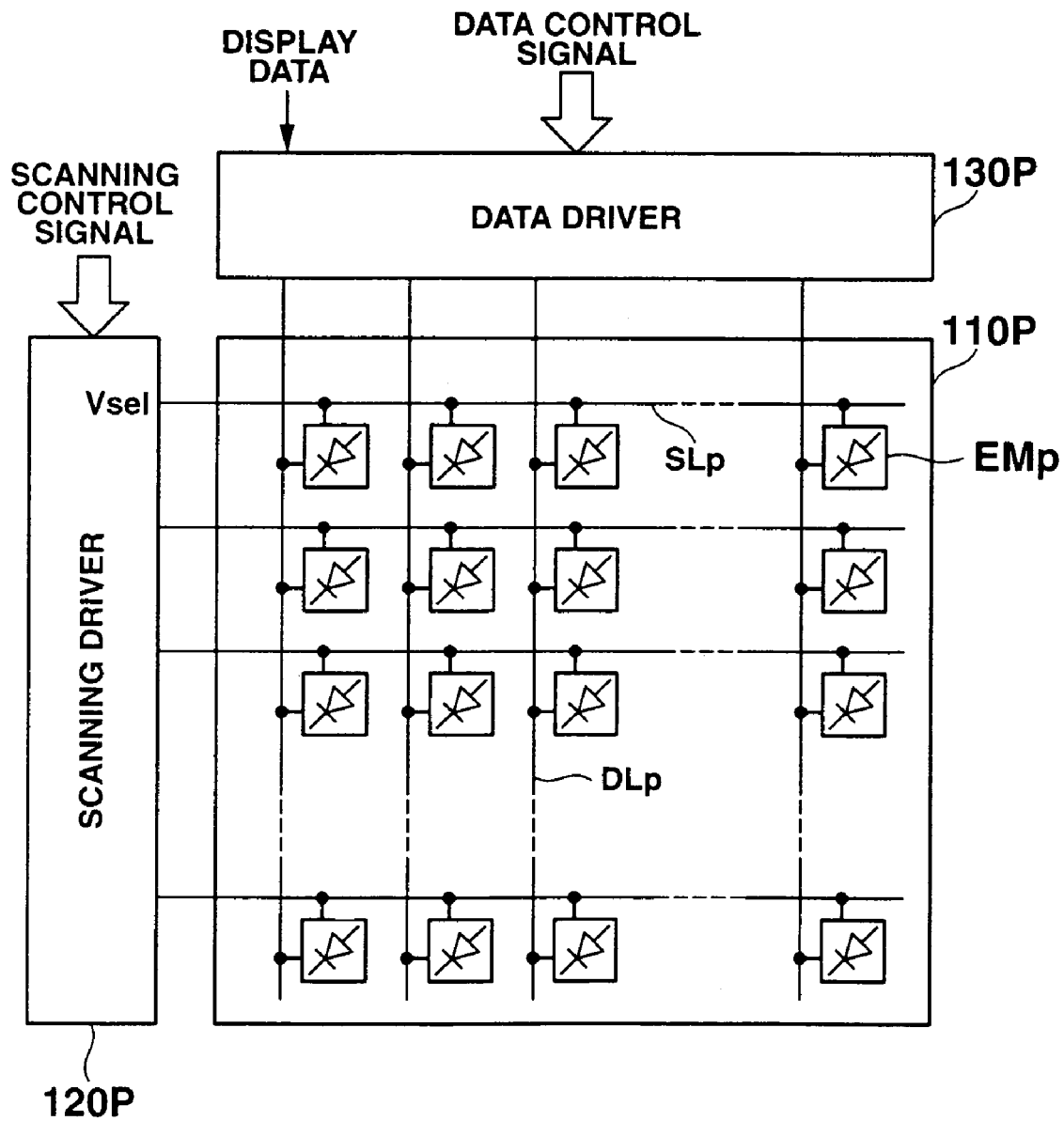
FIG. 19 is a schematic structural view showing a primary part of a conventional self-luminous type display.
Figure 20:
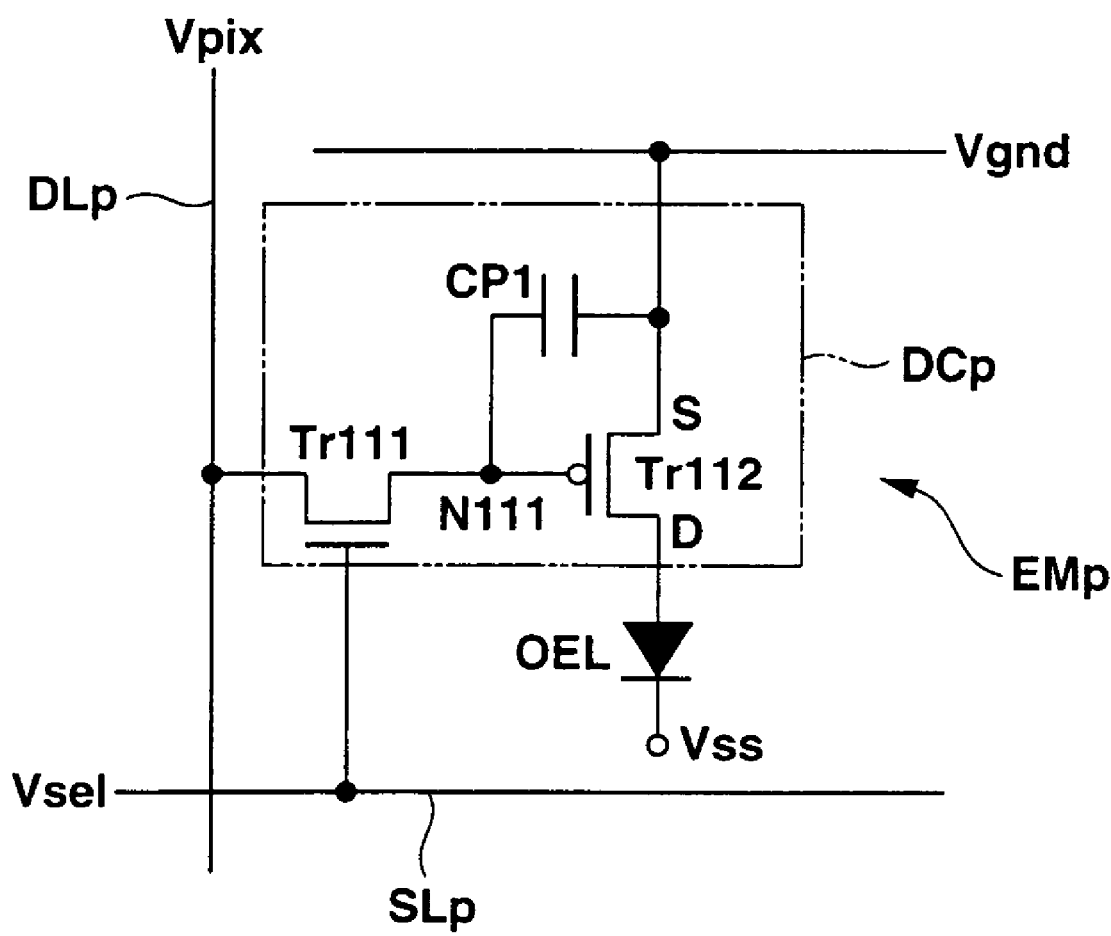
FIG. 20 is an equivalent circuit diagram showing a structural example of a display pixel which is applicable to the conventional self-luminous type display.

FIG. 18 is a characteristic view showing a relationship between parasitic capacitances of a light emission control thin film transistor and an output current (a driving current) with respect to a write current (a gradation signal current).

Here, like reference numerals denote the same circuit configurations as those in the foregoing embodiments, thereby simplifying the explanation.

As shown in FIG. 17, in the same circuit configuration as the display element drive circuit DCD depicted in FIG. 16, a display element drive circuit DCE according to this embodiment has a structure in which a capacitor Cad is connected with a parasitic capacitance Cgs1 between a gate and a source of a write control thin film transistor or first transistor Tr11 in parallel and a capacitance component (the parasitic capacitance Cgs1 between the gate and the source and the capacitor Cad) connected with a source side of the thin film transistor Tr11 is set to be larger than a capacitance component (a parasitic capacitance Cgd1 between the gate and a drain) connected with a drain side (Cgd1<Cgs1+Cac).

Although FIG. 17 shows the configuration in which the capacitor Cad is connected with the parasitic capacitance Cgs1 between the gate and the source in parallel to relatively increase the capacitance component connected with the source side, the present invention is not restricted thereto. Like the example described in conjunction with the fourth embodiment (FIG. 16), a gate width may be changed depending on a source electrode side and a drain electrode side so that the parasitic capacitance Cgs1 between the gate and the source becomes larger than the parasitic capacitance Cgd1 between the gate and the drain (Cgd1<Cgs1).

As described in the examination about the parasitic capacitances in the display element drive circuit, when the display element drive circuit shifts from the write operation state to the light emitting operation state, as shown in FIG. 7A, formation of capacitance coupling between the capacitor Cs and the parasitic capacitance Cgs1 between the gate and the source of the thin film transistor Tr11 reduces a voltage (a potential of a contact point N11) applied to the gate terminal of the light emission control thin film transistor Tr13, whereby there occurs a phenomenon that a driving current is decreased.

On the other hand, as described in conjunction with the second embodiment, in regard to a relationship between the parasitic capacitances of the thin film transistor Tr13 and the driving current (the output current) with respect to a gradation signal current (a write current) in the display element drive circuit DC, as shown in FIG. 14, when a parasitic capacitance Cgd3 between the gate and the drain of the thin film transistor Tr13 (a ratio with respect to the capacitor Cs; Cgd3/Cs) is increased, a current value of the output current with respect to the write current becomes large. Furthermore, even if the write current is zero, the output current (a leakage current) flows through the organic EL element OEL, and the light emitting operation is carried out even in black display, thus decreasing contrast.

A verification will be performed about conditions which cancel out an increase in the output current due to the parasitic capacitance Cgd3 between the gate and the drain of the thin film transistor Tr13.

When a change in a voltage (a voltage difference) $\Delta Vsel$ of a scanning signal immediately before and immediately after a shift from the write operation state to the light emitting operation state is represented as $\Delta Vsel = Vsel(L) - Vsel(H)$, although a displacement current flows between the respective capacitance components (the parasitic capacitances and the capacitor) by such capacitance coupling as shown in FIG. 7C with this fluctuation in a potential, the following Expressions (11) and (12) can be derived since a sum of the displacement currents flowing to the contact points N11 and N12 is zero.

$$Cgs2 \cdot (\Delta Vsel - \Delta Vn12) + (Cgs3 + Cs)(\Delta Vn11 - \Delta Vn12) - Coel \cdot \Delta Vn12 = 0 \qquad (11)$$

$$Cgs1 \cdot (\Delta Vsel - \Delta Vn11) + Cgd3(\Delta Vsc - \Delta Vn11) + (Cgs3 + Cs) - (\Delta Vn12 - \Delta Vn11) = 0 \qquad (12)$$

Here, $\Delta Vn11$ is a potential of the contact point N11, $\Delta Vn12$ is a potential of the contact point N12 and $\Delta Vsc$ is a voltage change of a power supply voltage Vsc.

Based on Expressions (11) and (12), the potential $\Delta Vn11$ of the contact point N11 and the potential $\Delta Vn12$ of the contact point N12 are solved to derive a variable $\Delta(Vn11 - Vn12) = \Delta Vn11 - \Delta Vn12$ corresponding to a fluctuation in the output current flowing through the thin film transistor Tr13. Then, the following Expression (13) can be obtained.

$$\Delta(Vn11-Vn12)=A/B \quad (13)$$

$$A=(Coel \cdot Cgs1 \cdot Cgd3 \cdot Cgs2) \cdot \Delta Vsel + (Cgs2+Coel) \cdot Cgd3 \cdot \Delta Vsc$$

$$B=(Cgs2+Coel) \cdot (Cgs1+Cgd3) + (Cgs2+Coel+Cgs1+Cgd3) - (Cgs3+Cs)$$

In Expression (13), when the gradation signal current (the write current) written in the display element drive circuit DC is zero (corresponding to black display), a difference in potential change between the contact points N11 and N12 ($\Delta Vn11 - \Delta Vn12$) is substantially zero. Therefore, if $\Delta(Vn11-Vn12)$ is equal to or greater than a threshold voltage Vth of the second transistor Tr12, the output current does not flow through the third transistor Tr13 with a change in a scanning signal Vsel and a power supply voltage Vsc when shifting to the light emitting operation state.

In other words, this means that setting the parasitic capacitance Cgs1 to be larger than a capacitance value of the parasitic capacitance Cgs1 satisfying the conditions under which a variable A in Expression (13) becomes zero can prevent a voltage difference (Vn11–Vn12) from becoming a positive value with a change in the scanning signal Vsel and the power supply voltage Vsc when shifting to the light emitting operation state, and the driving current can be prevented from flowing through the organic OEL when the write current is zero (corresponding to black display). That is, it is possible to cancel out an increase in the output current due to the parasitic capacitance Cgd3 between the gate and the drain of the third transistor Tr13.

In regard to an effect when such a parasitic capacitance Cgs1 between the gate and the source of the first transistor Tr11 is set to be large, as illustrated in FIG. 18 showing a relationship between the parasitic capacitances (Cgs1 and Cdg3) of the thin film transistors Tr11 and Tr13 and the driving current (the output current) with respect to the gradation signal current (the write current), it was confirmed that, even if the parasitic capacitance Cgd3 (a Cgd3/Cs ratio) between the gate and the drain of the third transistor Tr13 exists, setting the parasitic capacitance Cgs1 (a ratio with respect to the capacitor Cs; Cgs1/Cs) between the gate and the source of the thin film transistor Tr11 to be large to some extent or adding a capacitor Cad in parallel with the parasitic capacitance Cgs1 can prevent the driving current from flowing through the third transistor Tr13 when the gradation signal current (the write current) is zero and realize an excellent black display state, and the relationship of the driving current with respect to the write current demonstrates excellent linear characteristics.

Therefore, in this embodiment, applying the display element drive circuit DCE having such a configuration as shown in FIG. 16 or FIG. 17 to set the parasitic capacitance Cgs1 between the gate and the source in the first transistor Tr11 larger than the parasitic capacitance Cgd1 between the gate and the drain can decrease the driving current supplied to the organic EL element OEL in the light emitting operation. However, in the black display state, i.e., when the gradation signal current is zero, the driving current flowing through the organic EL element can be reduced to zero, thereby suppressing a decrease in contrast.

What is claimed is:

1. A display element drive circuit comprising:
   an electric charge holding circuit which holds as a voltage component electric charges based on a gradation signal corresponding to display data;
   a write control circuit which supplies the gradation signal to the electric charge holding circuit at a timing of application of a selection signal;
   a current control type display element; and
   a driving current control circuit which generates a driving current based on the voltage component held in the electric charge holding circuit and supplies the generated driving current to the display element, wherein:
   the write control circuit comprises: (i) a write transistor formed by a field effect transistor including a current path and a control terminal, wherein one end side of the current path is connected to a signal line through which the gradation signal is supplied, the other end side of the current path is connected to the driving current control circuit, and the gradation signal flows through the current path at a timing of application of the selection signal so that a write current is supplied to the driving current control circuit, and (ii) a control transistor formed by a field effect transistor and including a current path and a control terminal, wherein a predetermined power supply voltage is applied to one end side of the current path, the other end side of the current path is connected to the driving current control circuit, and the selection signal is applied to the control terminal of the control transistor,
   wherein each of the write transistor and the control transistor has a specific construction, which includes a gate electrode that has a predetermined gate length and that constitutes the control terminal, and a drain electrode and a source electrode constituting said one end side of the current path and said other end side of the current path,
   wherein a source-side parasitic capacitance of the control transistor is set to a value smaller than a capacitance value of a drain-side parasitic capacitance of the control transistor,
   wherein with the specific construction of the write transistor:
      a source-side parasitic capacitance is formed between the gate electrode and the source electrode of the write transistor and a drain-side parasitic capacitance is formed between the gate electrode and the drain electrode of the write transistor, the source-side parasitic capacitance and the drain-side parasitic capacitance having different capacitance values,
      a gate width of the gate electrode positioned on a side of one of the drain electrode and the source electrode is shorter than a predetermined gate width, and a gate width of the gate electrode positioned on a side of the other of the drain electrode and the source electrode is longer than the predetermined gate width, and
      a current of a predetermined current value flows through the current path via a channel region formed between the drain electrode and the source electrode when the gate, source and drain electrodes are respectively set to predetermined electric potentials,
   wherein said predetermined current value is a current value of a current which would flow through the current path between the drain and source electrodes, if a rectangular channel region formed between the source electrode and the drain electrode had gate widths respectively positioned on sides of the drain electrode and the source electrode set to said predetermined gate width, when the gate, source and drain electrodes are respectively set to the predetermined electric potentials, and
   wherein with the specific construction of the write transistor, one of the drain-side parasitic capacitance and the source-side parasitic capacitance which is formed in said one end side of the current path is set to a value smaller than a capacitance value of the other of the drain-side capacitance value and the source-side parasitic capacitance which is formed in said other end side of the current path.

2. The display element drive circuit according to claim 1, wherein opposite sides of the source electrode and the drain electrode of said specific construction are different in a width.

3. The display element drive circuit according to claim 2, wherein each of the opposite sides of the source electrode and the drain electrode of said specific construction has a circular arc shape.

4. The display element drive circuit according to claim 3, wherein the gate electrode of said specific construction has a circular arc strip-like planar shape.

5. The display element drive circuit according to claim 2, wherein each of the opposite sides of the source electrode and the drain electrode of said specific construction has a linear shape.

6. The display element drive circuit according to claim 5, wherein the gate electrode of said specific construction has a rectangular planar shape.

7. The display element drive circuit according to claim 1, wherein said specific construction has an element configuration including a semiconductor layer formed of amorphous silicon.

8. The display element drive circuit according to claim 1, wherein the driving current control circuit comprises a drive transistor formed by a field effect transistor including a current path and a control terminal, wherein a predetermined power supply voltage is applied to one end side of the current path of the drive transistor, the other end side of the current path of the drive transistor is connected to one end side of the display element, and a control signal generated by the write control circuit is applied to the control terminal of the drive transistor, thereby supplying the driving current to the display element, and
wherein the drive transistor has a specific construction that is the same as the specific construction of the write transistor.

9. The display element drive circuit according to claim 8, wherein the driving current control circuit supplies a current flowing through the current path of the drive transistor to the display element as the driving current, and
wherein the electric charge holding circuit comprises a capacitance element connected between the control terminal of the drive transistor and the other end side of the current path of the drive transistor.

10. The display element drive circuit according to claim 1, wherein the gradation signal is a gradation signal current having a current value corresponding to a luminance gradation of the display data.

11. The display element drive circuit according to claim 1, wherein the display element includes a light emitting element which operates to emit light with a predetermined luminance gradation in accordance with a current value of the driving current.

12. The display element drive circuit according to claim 11, wherein the light emitting element comprises an organic electroluminescent element.

13. A display apparatus which displays image information, comprising:
a display panel including:
a plurality of scanning lines and a plurality of signal lines arranged to be orthogonal to each other; and
a plurality of display pixels arranged in a vicinity of respective intersections of the respective scanning lines and signal lines,
wherein each of the display pixels comprises a current control type display element and a display element drive circuit which controls a light emitting operation of the display element, the display element drive circuit comprising:
an electric charge holding circuit which holds as a voltage component electric charges based on a gradation signal corresponding to display data;
a write control circuit which supplies the gradation signal to the electric charge holding circuit at a timing of application of a selection signal; and
a driving current control circuit which generates a driving current based on the voltage component held in the electric charge holding circuit and supplies the generated driving current to the corresponding display element, wherein:
the write control circuit comprises: (i) a write transistor formed by a field effect transistor including a current path and a control terminal, wherein one end side of the current path is connected to a signal line through which the gradation signal is supplied, the other end side of the current path is connected to the driving current control circuit, and the gradation signal flows through the current path at a timing of application of the selection signal so that a write current is supplied to the driving current control circuit, and (ii) a control transistor formed by a field effect transistor and including a current path and a control terminal, wherein a predetermined power supply voltage is applied to one end side of the current path, the other end side of the current path is connected to the driving current control circuit, and the selection signal is applied to the control terminal of the control transistor,
wherein each of the write transistor and the control transistor has a specific construction, which includes a gate electrode that has a predetermined gate length and that constitutes the control terminal, and a drain electrode and a source electrode constituting said one end side of the current path and said other end side of the current path,
wherein a source-side parasitic capacitance of the control transistor is set to a value smaller than a capacitance value of a drain-side parasitic capacitance of the control transistor,
wherein with the specific construction of the write transistor:
a source-side parasitic capacitance is formed between the gate electrode and the source electrode of the write transistor and a drain-side parasitic capacitance is formed between the gate electrode and the drain electrode of the write transistor, the source-side parasitic capacitance and the drain-side parasitic capacitance having different capacitance values,
a gate width of the gate electrode positioned on a side of one of the drain electrode and the source electrode is shorter than a predetermined gate width, and a gate width of the gate electrode positioned on a side of the other of the drain electrode and the source electrode is longer than the predetermined gate width, and
a current of a predetermined current value flows through the current path via a channel region formed between the drain electrode and the source electrode when the gate, source and drain electrodes are respectively set to predetermined electric potentials,
wherein said predetermined current value is a current value of a current which would flow through the current path between the drain and source electrodes, if a rectangular channel region formed between the source electrode and the drain electrode had gate widths respectively positioned on sides of the drain electrode and the source electrode set to said predetermined gate width, when the gate, source and drain electrodes are respectively set to the predetermined electric potentials, and wherein with the specific construction of the write transistor, one of the drain-side parasitic capacitance and the source-side parasitic capacitance which is formed in said one end side of the current path is set to a value smaller than a capacitance value of the other of the drain-side parasitic capacitance and the source-side parasitic capacitance which is formed in said other end side of the current path.

14. The display apparatus according to claim 13, wherein opposite sides of the source electrode and the drain electrode of said specific construction are different in width.

15. The display apparatus according to claim 14, wherein each of the opposite sides of the source electrode and the drain electrode of said specific construction has a circular arc shape.

16. The display apparatus according to claim 15, wherein the gate electrode of said specific construction has a circular arc strip-like planar shape.

17. The display apparatus according to claim 14, wherein each of the opposite sides of the source electrode and the drain electrode of said specific construction has a linear shape.

18. The display apparatus according to claim 17, wherein the gate electrode of said specific construction has a rectangular planar shape.

19. The display apparatus according to claim 13, wherein said specific construction has an element configuration comprising a semiconductor layer formed of amorphous silicon.

20. The display apparatus according to claim 13, further comprising:
a scanning drive circuit which sequentially applies the selection signal to each of the plurality of scanning lines in the display panel to set a selection state in which gradation signals are written in display pixels corresponding to a selected scanning line; and
a signal drive circuit which generates the gradation signals corresponding to the display pixels set in the selection state in accordance with the display data, and supplies the generated gradation signals to the plurality of signal lines.

21. The display apparatus according to claim 20, wherein each gradation signal supplied from the signal drive circuit is a gradation signal current having a current value corresponding to a luminance gradation of the display data.

22. A display apparatus which displays image information, comprising:
a display panel including:
a plurality of scanning lines and a plurality of signal lines arranged to be orthogonal to each other; and
a plurality of display pixels arranged in a vicinity of respective intersections of the respective scanning lines and signal lines,
wherein each of the display pixels comprises a current control type display element and a display element drive circuit which controls a light emitting operation of the display element, the display element drive circuit comprising:
an electric charge holding circuit which holds as a voltage component electric charges based on a gradation signal corresponding to display data;
a write control circuit which supplies the gradation signal to the electric charge holding circuit at a timing of application of a selection signal; and
a driving current control circuit which generates a driving current based on the voltage component held in the electric charge holding circuit and supplies the generated driving current to the corresponding display element, wherein:
the write control circuit comprises a write transistor formed by a field effect transistor including a current path and a control terminal, wherein one end side of the current path is connected to a signal line through which the gradation signal is supplied, the other end side of the current path is connected to the driving current control circuit, and the gradation signal flows through the current path at a timing of application of the selection signal so that a write current is supplied to the driving current control circuit,
wherein the write transistor has a specific construction which includes a gate electrode that has a predetermined gate length and that constitutes the control terminal, and a drain electrode and a source electrode constituting said one end side of the current path and said other end side of the current path,
wherein with the specific construction of the write transistor:
a source-side parasitic capacitance is formed between the gate electrode and the source electrode of the write transistor and a drain-side parasitic capacitance is formed between the gate electrode and the drain electrode of the write transistor, the source-side parasitic capacitance and the drain-side parasitic capacitance having different capacitance values,
a gate width of the gate electrode positioned on a side of one of the drain electrode and the source electrode is shorter than a predetermined gate width, and a gate width of the gate electrode positioned on a side of the other of the drain electrode and the source electrode is longer than the predetermined gate width, and
a current of a predetermined current value flows through the current path via a channel region formed between the drain electrode and the source electrode when the gate, source and drain electrodes are respectively set to predetermined electric potentials,
wherein said predetermined current value is a current value of a current which would flow through the current path between the drain and source electrodes, if a rectangular channel region formed between the source electrode and the drain electrode had gate widths respectively positioned on sides of the drain electrode and the source electrode set to said predetermined gate width, when the gate, source and drain electrodes are respectively set to the predetermined electric potentials,
wherein with the specific construction of the write transistor, one of the drain-side parasitic capacitance and the source-side parasitic capacitance which is formed in said one end side of the current path is set to a value smaller than a capacitance value of the other of the drain-side parasitic capacitance and the source-side parasitic capacitance which is formed in said other end side of the current path,
wherein the write control circuit further comprises a control transistor formed by a field effect transistor including a current path and a control terminal, wherein a predetermined power supply voltage is applied to one end side of the current path of the control transistor, the other end side of the current path of the control transistor is connected to the driving current control circuit, and the selection signal is applied to the control terminal of the control transistor, wherein the control transistor has a specific construction that is the same as the specific construction of the write transistor, and wherein a source-side parasitic capacitance of the control transistor is set to a value smaller than a capacitance value of a drain-side parasitic capacitance of the control transistor.

23. A display apparatus which displays image information, comprising:

a display panel including:

a plurality of scanning lines and a plurality of signal lines arranged to be orthogonal to each other; and a plurality of display pixels arranged in a vicinity of respective intersections of the respective scanning lines and signal lines, wherein each of the display pixels comprises a current control type display element and a display element drive circuit which controls a light emitting operation of the display element, the display element drive circuit comprising:

an electric charge holding circuit which holds as a voltage component electric charges based on a gradation signal corresponding to display data;

a write control circuit which supplies the gradation signal to the electric charge holding circuit at a timing of application of a selection signal; and a driving current control circuit which generates a driving current based on the voltage component held in the electric charge holding circuit and supplies the generated driving current to the corresponding display element, wherein:

the write control circuit comprises a write transistor formed by a field effect transistor including a current path and a control terminal, wherein one end side of the current path is connected to a signal line through which the gradation signal is supplied, the other end side of the current path is connected to the driving current control circuit, and the gradation signal flows through the current path at a timing of application of the selection signal so that a write current is supplied to the driving current control circuit, wherein the write transistor has a specific construction which includes a gate electrode that has a predetermined gate length and that constitutes the control terminal, and a drain electrode and a source electrode constituting said one end side of the current path and said other end side of the current path, wherein with the specific construction of the write transistor:

a source-side parasitic capacitance is formed between the gate electrode and the source electrode of the write transistor and a drain-side parasitic capacitance is formed between the gate electrode and the drain electrode of the write transistor, the source-side parasitic capacitance and the drain-side parasitic capacitance having different capacitance values, a gate width of the gate electrode positioned on a side of one of the drain electrode and the source electrode is shorter than a predetermined gate width, and a gate width of the gate electrode positioned on a side of the other of the drain electrode and the source electrode is longer than the predetermined gate width, and a current of a predetermined current value flows through the current path via a channel region formed between the drain electrode and the source electrode when the gate, source and drain electrodes are respectively set to predetermined electric potentials, wherein said predetermined current value is a current value of a current which would flow through the current path between the drain and source electrodes, if a rectangular channel region formed between the source electrode and the drain electrode had gate widths respectively positioned on sides of the drain electrode and the source electrode set to said predetermined gate width, when the gate, source and drain electrodes are respectively set to the predetermined electric potentials, wherein with the specific construction of the write transistor, one of the drain-side parasitic capacitance and the source-side parasitic capacitance which is formed in said one end side of the current path is set to a value smaller than a capacitance value of the other of the drain-side parasitic capacitance and the source-side parasitic capacitance which is formed in said other end side of the current path, wherein the write control circuit further comprises a control transistor formed by a field effect transistor including a current path and a control terminal, wherein a predetermined power supply voltage is applied to one end side of the current path of the control transistor, the other end side of the current path of the control transistor is connected to the driving current control circuit, and the selection signal is applied to the control terminal of the control transistor, wherein the control transistor has a specific construction that is the same as the specific construction of the write transistor, and wherein a source-side parasitic capacitance of the control transistor is set to a value larger than a capacitance value of a drain-side parasitic capacitance of the control transistor.

24. The display apparatus according to claim 13, wherein the driving current control circuit comprises a drive transistor formed by a field effect transistor including a current path and a control terminal, wherein a predetermined power supply voltage is applied to one end side of the current path of the drive transistor, the other end side of the current path of the drive transistor is connected to one end side of the corresponding display element, and a control signal generated by the write control circuit is applied to the control terminal of the drive transistor, thereby supplying the driving current to the corresponding display element, and wherein the drive transistor has a specific construction that is the same as the specific construction of the write transistor.

25. The display apparatus according to claim 24, wherein the driving current control circuit supplies a current flowing through the current path of the drive transistor to the corresponding display element as the driving current, and wherein the electric charge holding circuit comprises a capacitance element connected between the control terminal of the drive transistor and the other end side of the current path of the drive transistor.

26. The display apparatus according to claim 13, wherein each of the display elements includes a light emitting element which operates to emit light with a predetermined luminance gradation in accordance with a current value of the driving current.

27. The display apparatus according to claim 26, wherein the light emitting element includes an organic electroluminescent element.

* * * * *